(12) United States Patent
Sasagawa et al.

(10) Patent No.: US 6,748,574 B2
(45) Date of Patent: Jun. 8, 2004

(54) METHOD OF AND APPARATUS FOR DETERMINING AN OPTIMAL SOLUTION TO A UNIFORM-DENSITY LAYOUT PROBLEM, AND MEDIUM ON WHICH A PROGRAM FOR DETERMINING THE SOLUTION IS STORED

(75) Inventors: Fumiyoshi Sasagawa, Kawasaki (JP); Akio Shinagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 73 days.

(21) Appl. No.: 09/986,917

(22) Filed: Nov. 13, 2001

(65) Prior Publication Data

US 2002/0133797 A1 Sep. 19, 2002

(30) Foreign Application Priority Data

Mar. 14, 2001 (JP) ........................................ 2001-073141

(51) Int. Cl.[7] .............................................. G06F 17/50
(52) U.S. Cl. ................................................ 716/9; 716/8
(58) Field of Search ................................... 716/9, 8

(56) References Cited

U.S. PATENT DOCUMENTS

| 5,818,729 A | | 10/1998 | Wang et al. | |
| 5,870,312 A | * | 2/1999 | Scepanovic et al. | .......... 716/10 |
| 6,301,693 B1 | | 10/2001 | Naylor et al. | |

FOREIGN PATENT DOCUMENTS

| JP | 11-134315 | 5/1999 |
| JP | 2000-90065 | 3/2000 |
| JP | 2000-305920 | 11/2000 |

OTHER PUBLICATIONS

Esbensen et al., "Design Space Exploration Using the Genetic Algorithm", IEEE 1996.*
Esbensen et al., "An MCM/IC Timing–Driven Placement Algorithm Featuring Explicit Design Space Exploration", IEEE, 1996.*
Lee et al., "Evolutionary Algorithms Based Multiobjective Optimization Techniques for Intelligent Systems Design", IEEE, 1996.*
Rebaudengo et al., "Gallo: A Genetic Algorithm for Floorplan Area Optimization", IEEE, 1996.*
R. Tsay, et al. "Proud: A Sea–Of–Gates Placement Algorithm," IEEE Design & Test of Computers, 1988.

* cited by examiner

Primary Examiner—Vuthe Siek
Assistant Examiner—Brandon Bowers
(74) Attorney, Agent, or Firm—Staas & Halsey LLP

(57) ABSTRACT

A uniform-density layout problem requires an optimal layout of multiple elements in a predetermined region under a set of conditions including a density-uniformization condition. The method determines an optimal solution to the problem and comprises the steps of: (a) obtaining an initial layout of the multiple elements in the predetermined region; (b) generating a linear combination of a first objective function, which represents the remaining conditions other than the density-uniformalization condition, and a second objective function, which represents the density-uniformalization condition, as a third objective function, which is assumed to represent the set of conditions of the problem; and (c) optimizing the third objective function by executing an iterative-improvement algorithm on the third objective function using the initial layout as an initial solution. The invention is especially useful to determine a layout of multiple circuit elements in designing LSI circuits and the like.

57 Claims, 28 Drawing Sheets

FIG. 19

METHOD OF AND APPARATUS FOR DETERMINING AN OPTIMAL SOLUTION TO A UNIFORM-DENSITY LAYOUT PROBLEM, AND MEDIUM ON WHICH A PROGRAM FOR DETERMINING THE SOLUTION IS STORED

BACKGROUND OF THE INVENTION

1) Field of the Invention

The present invention relates to a method of and apparatus for determining an optimal solution to a uniform-density layout problem (a layout problem with a density-uniformalization condition), and also relates to a storage medium on which a program for determining the optimal solution is stored.

2) Description of the Related Art

In various fields, a kind of problem is known which requires arranging multiple elements (object elements) under certain conditions (layout conditions) in an optimum state. Such kind of problem is commonly called "a layout problem", "an optimal layout problem", "a layout optimization problem", "a graph-mapping problem", and the like (in the following, such kind of problem is referred to simply as "a layout problem" for convenience of description. The term "layout problem" is used in a common broad meaning for the present, until it is defined strictly later).

To take the above-mentioned LSI-circuits designing as an example, it is required to arrange multiple circuit elements (object elements) on a substrate with meeting the following conditions (layout conditions).

Each of the circuit elements must have a specific size and shape of its own.

The circuit elements must be subjected to a predetermined interconnection relationship.

The circuit elements must be arranged within a specified region on the substrate.

Such requirement is therefore just equivalent to the above-mentioned layout problem.

Other examples of the layout problem include a problem of optimizing delivery routes using trucks, a problem of optimizing operation schedules of factories, a problem of optimizing service diagrams of transport facilities, a problem of optimizing service schedules of nurses, a problem of optimizing Gantt chart (chart showing the relation between working hours and the quantity of production), etc.

A desirable solution to the layout problem is a layout of the object elements that satisfies the layout conditions in as optimum the state as possible. Such a solution is commonly called "a layout-optimizing solution", "an optimal layout solution", or simply "an optimal solution" (in the following, such kind of solution is referred to simply as "an optimal solution" for convenience of description. The term "optimal solution" also is used in a common broad meaning for the present, until it is defined strictly later).

A common process of obtaining an optimal solution to a layout problem is to introduce an objective function representing the desirability of a layout solution to the layout conditions and to determine the optimal solution using the objective function.

Specifically, an objective function is formulated so that it increases (or decreases) as desirable the state as it satisfies the layout conditions. And a layout solution that minimizes (or maximizes) the formulated objective function is calculated and determined as the optimal solution.

However, when there are many object elements and the layout conditions are complicated, the objective function is of so high order and so complicated that it is impossible or, even if not so, extremely difficult in practice to calculate exactly the right solution that minimizes (or maximizes) the objective function, because it requires huge operation time.

In such a case, the following technique is commonly used: to improve gradually an initial layout solution to the objective function using an iterative improvement method; to evaluate repeatedly a current layout solution in the improving one after another against specified criteria; and, when there appears any layout solution that satisfies the criteria, to determine the satisfactory layout solution as an approximately optimal solution to the objective function (such a process is often called "optimization of an objective function"). Examples of algorithms used for such optimization include the min-cut algorithm, the n-elements exchanging algorithm, the self-organization algorithm, etc.

To deal with a problem being of a higher order and more complicated, a technique using a so-called genetic algorithm is often used (although such an algorithm is otherwise called by various names, such as an evolutionary programming, and although their strict meanings differ from each other, the term "genetic algorithm" is generically used in a broad meaning throughout the following description). In this technique, various layout solutions being candidates for an optimal solution are expressed as genes, and a group of chromosomes each being a linear string of the genes are generated. Various kinds of operation such as selection, reproduction, crossover, mutation, etc. (genetic operations), are repeatedly performed on the group of chromosomes (population) while the generation of the population is updated. When there appears any gene representing a layout solution that satisfies given criteria, the satisfactory layout solution is determined as an approximately optimal solution to the objective function.

With such techniques as described above, it is possible to obtain, although not a strictly optimal solution objective function that would completely minimize (or maximize) the objective function, an approximately optimal solution that would almost minimize (or maximize) the objective function, with high accuracy enough for practical use.

In the following description, both the process of calculating a strictly optimal solution to a layout problem, as above-described firstly, and the techniques of obtaining any layout solution that satisfies given criteria to determine as an approximately optimal solution to a layout problem, as above-described subsequently, are generically called "to solve a layout problem" or "to search for an optimal solution to a layout problem".

In the meantime, there is a kind of layout problem including a condition that the multiple object elements must be distributed in substantially uniform density (hereinafter called a "density-uniformalization condition"). The layout problem of this kind is referred to as a "uniform-density layout problem" in the following description.

To take the above-mentioned LSI-circuits designing for example again, in addition to the several layout conditions enumerated previously, another condition requiring the multiple object elements to be distributed in substantially uniform density will be demanded actually.

When object elements are numerous and the other layout conditions are much complicated, the density-uniformalization condition is too difficult and too rigid to be satisfied. Consequently, even if any objective function reflecting all the layout conditions including density-uniformalization condition (generic objective function) were formulated, the order of such an objective function would be excessive, so that it is quite difficult to search for an optimal solution to the objective function.

Thus the following technique has been taken conventionally in order to search for an optimal solution to the uniform-density layout problem: generating an objective function based on the remaining layout conditions other than the density-uniformalization condition; searching for a provisional optimal solution using the generated objective function; and improving the provisional optimal solution by executing an algorithm of some kind for reducing non-uniformity in density of the multiple object elements. Examples of such conventional non-uniformity reducing algorithm include the ones that the inventors proposed previously (Japanese Patent Laid-Open Publication No. HEI 11-134315 and Japanese Patent Laid-Open Publication No. 2000-90065), the one disclosed in REN-SONG TSAY et al., "PROUD: A SEA-OF-GATES PLACEMENT ALGORITHM" (IEEE DESIGN & TEST OF COMPUTERS, 1988), etc.

However, when solving a uniform-density layout problem by the above-mentioned conventional technique, huge arithmetic processing will be needed for executing the non-uniformity reducing algorithm in addition to the optimization of the objective function relating to the other layout conditions, so that it will take very long time to search for the optimal solution.

As the LSI design technology and other various technologies are growing more developed and more complicated in recent years, it is expected that such layout problems as to require the search of an optimal solution under a density-uniformalization condition will be more increased and more complicated from now on. Against this backdrop, it is desired to develop a technology for determining an optimal solution to a uniform-density layout problem more efficiently and with a higher speed, even if the object elements are numerous and the layout conditions are extremely complicated.

SUMMARY OF THE INVENTION

With the foregoing problems in view, it is an object of the present invention to provide a method of and apparatus for determining more efficiently an optimal solution to a uniform-density layout problem with high speed, even if the object elements are numerous and the layout conditions are quite complicated.

In addition, another object of the present invention is to provide a storage medium storing a program for making a computer to execute the method for determining an optimal solution.

According to an aspect of the present invention, there is provided a computer-implemented method of determining a first optimal solution to a first layout problem requiring an optimal layout of a multiplicity of elements in a predetermined region under a first set of conditions, which includes a uniformalization condition such that the multiple elements are distributed in substantially uniform density throughout the predetermined region, as the first optimal solution, wherein said first layout problem is analyzable into the uniformalization condition and a second layout problem requiring an optimal layout of the multiple elements in the same predetermined region under a second set of conditions, which consists of the remaining conditions of the first set of conditions other than the uniformalization condition, as a second optimal solution, comprising the steps of: (A) generating a linear combination of a first objective function, which represents the second set of conditions of said second layout problem, and a second objective function, which represents the uniformalization condition of said first layout problem, as a third objective function, which is assumed to represent the first set of conditions of said first layout problem; and (B) optimizing said third objective function generated in said step (A), whereby the first optimal solution to the first layout problem is determined.

According to another aspect of the present invention, there is provided a computer-implemented method of determining a first optimal solution to the first layout problem, comprising the steps of: (a) obtaining an initial layout of the multiple elements in the predetermined region; (b) generating a linear combination of a first objective function, which represents the second set of conditions of said second layout problem, and a second objective function, which represents the uniformalization condition of said first layout problem, as a third objective function, which is assumed to represent the first set of conditions of said first layout problem; and (c) optimizing the third objective function generated in said step (b) by executing an iterative-improvement algorithm on said third objective function using said initial layout obtained in said step (a) as an initial solution, whereby the first optimal solution to the first layout problem is determined.

As a preferable feature of the present invention, said method further comprises the step of (d) representing at least one of a group of one or more first parameters, which relate to said generating of said third objective function in said step (b), and a group of one or more second parameters, which relate to said executing of said iterative-improvement algorithm in said step (c), as genes and executing a genetic algorithm on an initial population of individuals each of which has at least one chromosome being a string of the genes; and at least one of said generating of said third objective function in said step (b) and said executing of said iterative-improvement algorithm in said step (c) is carried out based on parameters represented by genes included in chromosomes of the individuals in the resultant population from said executing of said genetic algorithm in said step (d).

As another preferable feature, said generating of said third objective function in said step (b), said executing of said iterative-improvement algorithm in said step (c) and, as the case may be, said executing of said genetic algorithm in said step (d) are repeatedly carried out according to a predetermined schedule.

As still another preferable feature, in said step (a), said second optimal solution to said second objective function is determined and obtained as said initial layout.

As a further preferable feature, in said step (B) or (b), at least one of a function relating to density of the multiple elements, a function relating to area density of the multiple elements, a function relating to the number of overlaps between any two or more of the multiple elements and a function relating to the total area of overlaps between any two or more of the multiple elements is generated as said second objective function.

As a still further preferable feature, said step (b) includes: making a virtual layout of the multiple elements in the predetermined region, based on a current actual layout of the multiple elements in the predetermined region, in such a manner that the multiple elements are distributed in substantially uniform density throughout the predetermined region; and generating a function which represents a relationship between said virtual layout of the multiple elements and said current actual layout of the multiple elements as said second objective function.

In the last case, it is preferable that in said step (b), the multiple elements are virtually disposed next to one another with respect to one of 1) a vertex of the predetermined region, 2) a side of the predetermined region, 3) a center of the predetermined region or 4) an alternately selected one of vertices of the predetermined region, so as to arrange the multiple elements in said virtual layout.

As an additional preferable feature, in said step (b), if the predetermined region has any local subregion in which an actual layout of the multiple elements is to be prohibited, the multiple elements are skipped over said local subregion while the multiple elements are arranged in the predetermined region in said virtual layout. And if any one of the multiple elements is placed in a virtual position to overlap said local subregion while the multiple elements are arranged in said virtual layout, said virtual position of said one element is shifted outwardly off said local subregion in such a direction 1) that a distance between a current actual position of said one element and the shifted virtual position of said one element is minimal, 2) that a distance between an outline of the local subregion and an outline of the predetermined region is maximal, or 3) that a distance of shifting of said virtual position of said one element is minimal.

As a still additional preferable feature, in said step (b), the multiple elements are arranged in said virtual layout 1) based on said initial layout of the multiple elements obtained in said step (a), 2) at each of one or more scheduled occasions in accordance with said predetermined schedule, based on said current actual layout of the multiple elements in said step (c) for each of the occasions, or 3) at each of one or more random occasions, based on said current actual layout of the multiple elements in said step (c) for each of the occasions.

As an further additional preferable feature, in said step (b), said generating of a new third objective function is carried out at each of a plurality of scheduled occasions in accordance with said predetermined schedule, while at least one of 1) a coefficient of said linear combination of said first and second objective functions and 2) a definition of said second objective function varies for each of the occasions.

As a still further additional preferable feature, in said step (d), at least either of 1) one or more coefficients of said third objective function generated in said step (b) and 2) parameters of said predetermined schedule are represented by genes, and the chromosome of each individual is generated using said genes.

In the former case, it is preferable that 1) in said step (d), assuming that said third objective function generated in said step (b) is expressed as Cost+αU where Cost is said first objective function and U is said second objective function, the coefficient α is represented by said genes, and that 2) assuming that said third objective function generated in said step (b) is expressed as $(Cost_x+\alpha_x U_x)+(Cost_y+\alpha_y U_y)$ where $Cost_x$ is an x-coordinate component of said first objective function, $Cost_y$ is a y-coordinate component of said first objective function, $U_x$ is an x-coordinate component of said second objective function, and $U_y$ is a y-coordinate component of said second objective function, the coefficient $\alpha_x$ and the coefficient $\alpha_y$ are represented by said genes.

It is also preferable that 1) in said step (d), assuming that said third objective function generated in said step (b) is expressed as Cost+αU where Cost is said first objective function and U is said second objective function, and that α is a function of a current iteration count of said iterative-improvement algorithm with coefficients $\beta_1, \beta_2, \ldots, \beta_n$, the coefficients $\beta_1, \beta_2, \ldots, \beta_n$ are represented by said genes, and that 2) assuming that said third objective function generated in said step (b) is expressed as $(Cost_x+\alpha_x U_x)+(Cost_y+\alpha_y U_y)$ where $Cost_x$ is an x-coordinate component of said first objective function, $Cost_y$ is a y-coordinate component of said first objective function, $U_x$ is an x-coordinate component of said second objective function, $U_y$ is a y-coordinate component of said second objective function, $\alpha_x$ is a function of a current iteration count of said iterative-improvement algorithm with coefficients $\beta_{x1}, \beta_{x2}, \ldots, \beta_{xn}$, and $\alpha_y$ is a function of a current iteration count of said iterative-improvement algorithm with coefficients $\beta_{y1}, \beta_{y2}, \ldots, \beta_{yn}$, the coefficients $\beta_{x1}, \beta_{x2}, \ldots, \beta_{xn}$ and the coefficients $\beta_{y1}, \beta_{y2}, \ldots, \beta_{yn}$ are represented by said genes.

As a still further additional preferable feature, said step (d) includes performing an exchanging crossover, or a weighting crossover based on a weighted average of gene values of the two individuals of said pair, as a genetic operation on at least one pair of individuals in the population.

As a still further additional preferable feature, said step (d) includes performing a mutation as a genetic operation on at least one individual in the population by varying a gene value of the one individual at random within a predetermined range or, when a resultant layout of the multiple elements from a previous execution of said iterative-improvement algorithm in said step (c) does not meet a predetermined criterion, by varying a gene value of the one individual within such a range that the layout of the multiple elements is improved.

As a still further additional preferable feature, said step (d) includes: evaluating a fitness of each of individuals of a current population based on a result of a previous execution of said iterative-improvement algorithm in said step (c); selecting a number of individuals from the individuals of the current population based on the evaluated fitness of each said individual to thereby generate a new population; and executing said genetic algorithm on the generated new generation. In this case, it is preferable that said evaluating in said step (d) calculates a fitness value for each said individual using said first objective function and evaluates the fitness of each said individual based on the calculated fitness value.

As a still further additional preferable feature, said step (d) includes: dividing individuals of a current population into a plurality of subpopulations in accordance with a kind of genes included in a chromosome of each of the individuals of the current population; executing said genetic algorithm on each of the plural subpopulations separately; and during said executing said genetic algorithm, exchanging a number of individuals between the plural subpopulations in accordance with said predetermined schedule.

Specifically, it is preferable that in said step (d), the individuals of the current population is divided into 1) a first subpopulation of individuals, each of which has genes representing parameters of said third objective function generated in said step (b), 2) a second subpopulation of individuals, each of which has genes representing parameters of said predetermined schedule, and 3) a third subpopulation of individuals, each of which has both genes representing parameters of said third objective function generated in said step (b) and genes representing parameters of said predetermined schedule.

In this case, it is preferable that 1) said step (d) includes: selecting one individual from the first subpopulation and another individual from the second subpopulation as parents; performing a crossover operation on a pair of chromosomes of the parents to thereby generate a pair of chromosomes for children; and migrating a pair of children, each of which has a respective one of the generated chromosome pair, into the third subpopulation, and 2) that said step (d) includes: selecting one individual from the first or second subpopulation and another individual from the third subpopulation as parents; performing a crossover operation on a pair of chromosomes of the parents to thereby generate a pair of chromosomes for children; and migrating a pair of children, each of which has a respective one of the generated chromosome pair, into the first or second subpopulation and the third subpopulation respectively.

According to still another aspect of the present invention, there is provided an apparatus for determining a first optimal solution to the first layout problem, comprising: an objective-function generating section for generating a linear combination of a first objective function, which represents the second set of conditions of the formulated second layout problem, and a second objective function, which represents the uniformalization condition of the first layout problem, as a third objective function, which is assumed to represent the first set of conditions of the first layout problem; and an objective-function optimizing section for optimizing the third objective function generated by said objective-function generating section, thereby determining the first optimal solution to the first layout problem.

According to a further aspect of the present invention, there is provided an apparatus for determining a first optimal solution to the first layout problem, comprising: an initial-layout obtaining section for obtaining an initial layout of the multiple elements in the predetermined region; an objective-function generating section for generating a linear combination of a first objective function, which represents the second set of conditions of the formulated second layout problem, and a second objective function, which represents the uniformalization condition of the first layout problem, as a third objective function, which is assumed to represent the first set of conditions of the first layout problem; and an iterative-improvement-algorithm executing section for optimizing the third objective function generated in said objective-function generating section by executing an iterative-improvement algorithm on the third objective function using the initial layout obtained in said initial-layout obtaining section as an initial solution, thereby determining the first optimal solution to the first layout problem.

As a preferable feature of the present invention, said apparatus further comprises a genetic-algorithm executing section for representing at least one of a group of one or more first parameters, which relate to the generating of the third objective function in said objective-function generating section, and a group of one or more second parameters, which relate to the executing of the iterative-improvement algorithm in said iterative-improvement-algorithm executing section, as genes and for executing a genetic algorithm on an initial population of individuals each of which has at least one chromosome being a string of the genes; wherein at least one of the generating of the third objective function in said objective-function generating section and the executing of the iterative-improvement algorithm in said iterative-improvement-algorithm executing section is carried out based on parameters represented by genes included in chromosomes of the individuals in the resultant population from the executing of the genetic algorithm in said genetic-algorithm executing section.

As another preferable feature of the present invention, said apparatus further comprises a schedule management section for preparing a schedule relating to the generation of the third objective function by said objective-function generating section, the execution of the iterative-improvement algorithm by said iterative-improvement-algorithm executing section and, as the case may be, the execution of the genetic algorithm by said genetic-algorithm executing section, and for controlling said objective-function generating section, said iterative-improvement-algorithm executing section and said genetic-algorithm executing section to iteratively carry out the generation of the third objective function, the execution of the iterative-improvement algorithm and the execution of the genetic algorithm according to the prepared schedule.

According to a still further aspect of the present invention, there is provided a computer-readable storage medium storing a computer program for determining a first optimal solution to the first layout problem, wherein said program instructs a computer to carry out the procedures corresponding to the steps of the method of the present invention:

With the foregoing features of the method, apparatus and medium according to the present invention, it is possible to guarantee the following advantageous results.

(1) Since an optimal solution to a given uniform-density layout problem can be searched for using only a single objective function being relatively simple and of low order (third objective function), it is possible to determine efficiently the optimal solution with high speed, without the need of any special procedure for reducing non-uniformity in density of the multiple object elements.

(2) Even if the object elements are numerous and the layout conditions are complicated, since an optimal solution to a given uniform-density layout problem can be searched for by iteratively improving an initial solution through the optimization of a simple objective function being of relatively low order (third objective function), it is possible to determine efficiently the optimal solution with high speed, without the need of any special procedure for reducing non-uniformity in density of the multiple object elements.

(3) Even if the object elements are still more numerous and the layout conditions are quite complicated, it is possible to appropriately determine various parameters necessary for generating the third objective function and/or executing the iterative-improvement algorithm objective function with high speed by executing a genetic algorithm according to details of the uniform-density layout problem, so that the speed of and the efficiency in determining the optimal solution is further improved.

(4) Since an appropriate third objective function is newly generated occasionally in accordance with the progress of the iterative improvement, it is possible to improve the speed of and the efficiency in determining the optimal solution.

(5) Since a layout appropriately reflecting the remaining layout conditions other than the density-uniformalization condition is obtained and used as an initial layout for the search of the optimal solution to the uniform-density layout problem, it is possible to improve the speed of and the efficiency in determining the optimal solution.

(6) Since a relatively simple function (second objective function) appropriately representing the density-uniformalization condition is used, it is possible to generate an appropriate objective function (third objective function) representing the uniform-density layout problem with high speed, so that the speed of and the efficiency in determining the optimal solution is further improved.

(7) Since parameters relating to objective function (third objective function) and parameters relating to the execution of each step are determined appropriately with high speed in accordance with the features of the uniform-density layout problem, it is possible to improve the speed of and the efficiency in determining the optimal solution.
(8) Since the appropriate parameters are determined effectively by evaluating the fitness value of each chromosome, it is possible to generate an appropriate objective function (third objective function) representing the uniform-density layout problem with high speed, so that the speed of and the efficiency in determining the optimal solution is further improved.
(9) Since the appropriate parameters are determined effectively based on a great diversity of chromosomes, it is possible to generate an appropriate objective function (third objective function) representing the uniform-density layout problem with high speed, so that the speed of and the efficiency in determining the optimal solution is further improved.
(10) Since a computer-readable storage medium is provided which stores a computer program instructing a computer to carry out the method of the present invention, it is possible to carry out the present method in various environments, so that the present invention can be applied to solve uniform-density layout problems in diverse situations.

BRIEF DESCRIPTION OF THE DRAWINGS

FIG. 19 is a diagram illustrating an exchanging crossover performed during the genetic algorithm in the embodiment;

DESCRIPTION OF THE PREFERRED EMBODIMENTS

In the following, preferred embodiments of the present invention will be described with reference to the drawings.

It is to be noted that in the following description, for convenience of description, a problem of arranging multiple object elements in a predetermined region under a set of conditions is referred to as "a layout problem" (or "a second layout problem"), and a problem formulated by adding a condition that the multiple object elements must be distributed in substantially uniform density (density-uniformalization condition) to "a layout problem" is referred to as "a uniform-density layout problem" (or "a first layout problem"). In other words, "a uniform-density layout problem" is analyzable into the density-uniformalization condition and "a layout problem".

(1) Description of Configuration of Optimal-solution Determining Apparatus to Uniform-density Layout Problem According to Embodiment of the Present Invention.

Figure 1:
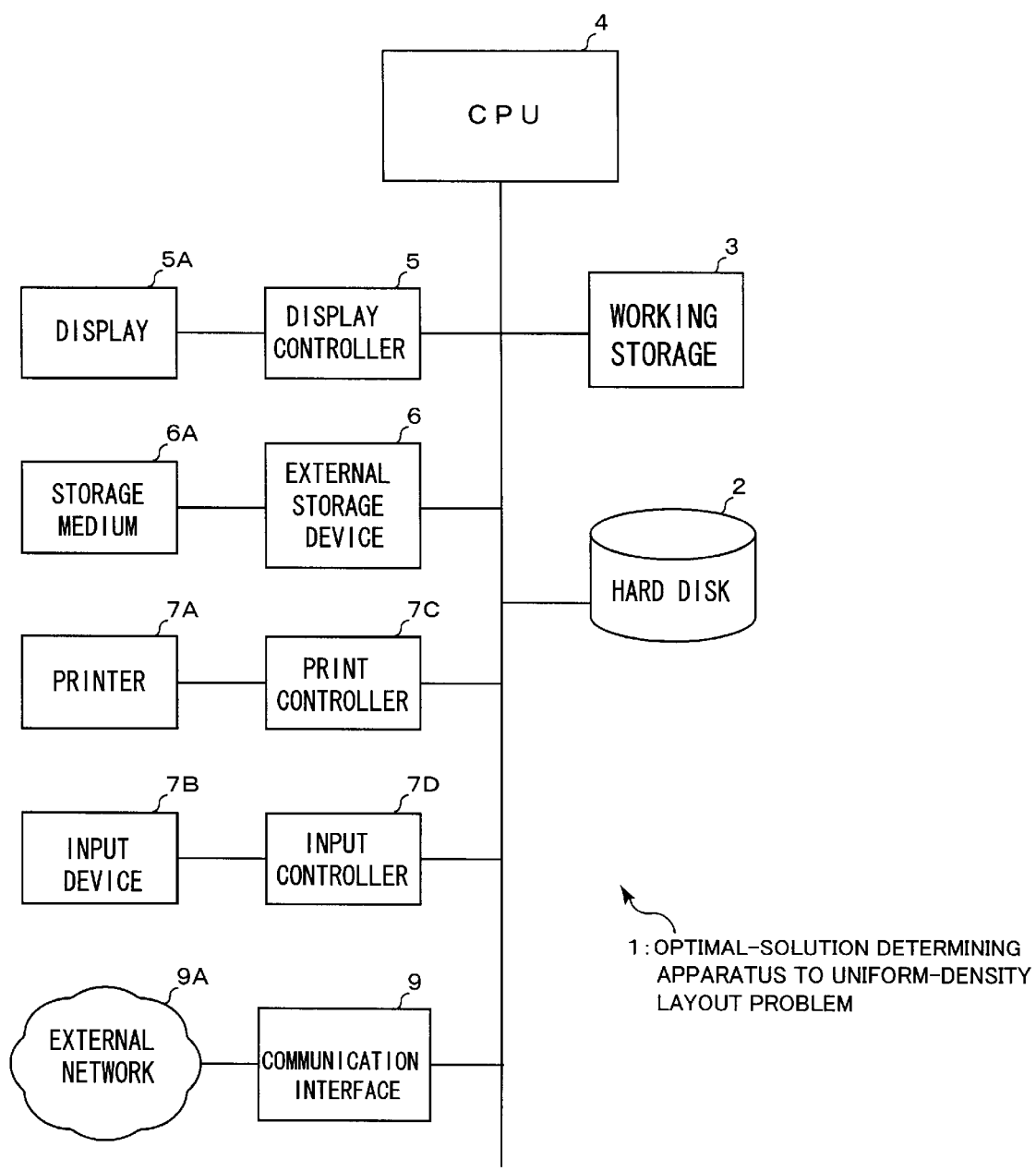
FIG. 1 is a block diagram showing a configuration of an optimal-solution determining apparatus according to an embodiment of the present invention.

FIG. 1 is a block diagram showing arrangements of an optimal-solution determining apparatus to a uniform-density layout problem according to an embodiment of the present invention. When such a uniform-density layout problem as described above is given, the optimal-solution determining apparatus 1 shown in FIG. 1 is operable to determine an optimal solution to the given uniform-density layout problem.

In FIG. 1, reference numeral 3 designates a working storage such as a RAM (random-access memory) subjected to the reading and writing of data necessary for various kinds of processing; reference numeral 5A designates a display for displaying various kinds of screens such as a configuration screen or a screen indicating the resultant layout solution of the multiple object elements from the processing; reference numeral 5 designates a display controller for controlling the display state on the display 5A; reference numeral 7B designates an input device, such as a keyboard or a mouse, for enabling an operator, with reference to a screen displayed on the display 5A, to input various data responsive to the displayed screen; and reference numeral 7D designates an input controller for controlling the input device 7B.

Reference numeral 2 designates a hard disk for storing various data (such as an operating system) necessary for the operation of the optimal-solution determining apparatus 1, and for also storing an optimal-solution determining program to a uniform-density layout problem, which will be described later. Reference numeral 6 designates an external storage device, such as a CD-ROM drive or a MO drive; reference numeral 6A designates a storage medium, such as a CD-ROM disk or MO disk, corresponding to the external storage device 6; reference numeral 7A designates a printer; and reference numeral 7C designates a print controller. Responsive to instructions inputted via the input device 7B, the layout solution of multiple object elements displayed on the display 5A is recorded on the record medium 6A by the external storage device 6, and also recorded on a predetermined sheet by the printer 7A.

Reference numeral 9 designates a communication interface for controlling input/output of various data from/to an external network 9A outside the apparatus 1 such as a LAN, a WAN or the Internet. The communication interface 9 connects the apparatus 1 with the external network 9A, so that the apparatus 1 is communicable via the external network 9A by wire transmission or radio transmission to share various resources in the external network 9A.

Figure 2:
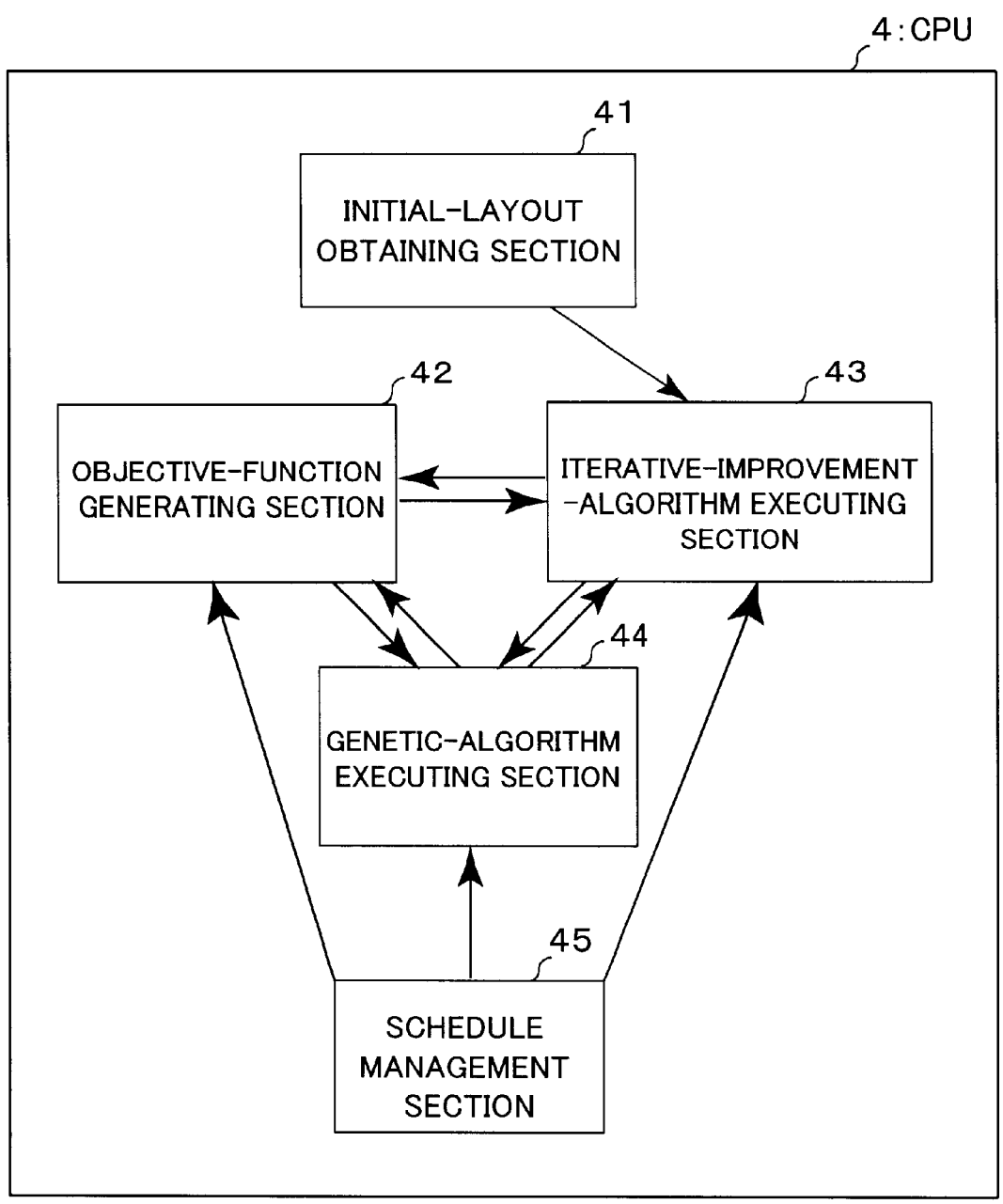
FIG. 2 is a block diagram showing a detailed configuration of the main part of the optimal-solution determining apparatus according to the embodiment.

Reference numeral 4 designates a CPU (central processing unit) for centrally managing the principal components of the apparatus 1. As shown in FIG. 2A, in the optimal-solution determining apparatus 1 according to the present embodiment, the CPU 4 functions as a initial-layout obtaining section 41, an objective-function generating section 42, an iterative-improvement-algorithm executing section 43, a genetic-algorithm executing section 44 and a schedule management section 45.

The initial-layout obtaining section 41 is operable to obtain data on an initial layout of the multiple object elements relating to the given uniform-density layout problem.

The objective-function generating section 42 is operable to generate a linear combination of a first objective function, which represents the remaining conditions of the given uniform-density layout problem other than the density-uniformalization condition (the layout conditions of the layout problem), and a second objective function, which represents the density-uniformalization condition, as a third objective function, which is assumed to represent the layout conditions of the given uniform-density layout problem.

The iterative-improvement-algorithm executing section 43 is operable to optimize the third objective function from the objective-function generating section 42 by executing an iterative-improvement algorithm on the third objective function using the initial layout obtained by the initial-layout obtaining section 41 as an initial solution, thereby determining an optimal solution to the given uniform-density layout problem.

The genetic-algorithm executing section 44 is operable to represent parameters relating to the generating of the third objective function by the objective-function generating section 42 and/or parameters relating to the executing of the iterative-improvement algorithm by the iterative-improvement-algorithm executing section 43 as genes, to generate chromosomes each being a linear string of the genes, and to execute a genetic algorithm using the chromosomes as individuals of the initial population.

Further, upon the conclusion of the genetic algorithm by the genetic-algorithm executing section 44, the objective-function generating section 42 and the iterative-improvement-algorithm executing section 43 is operable to carry out the generation of the third objective function and the execution of the iterative-improvement algorithm, respectively, based on parameters represented by genes included in chromosomes of the individuals in the resultant population from the genetic algorithm.

The schedule management section 45 is operable to obtain a schedule defining timings for the generation of the third objective function by the objective-function generating section 42, the execution of the iterative-improvement algorithm by the iterative-improvement-algorithm executing section 43, and the execution of the genetic algorithm by the genetic-algorithm executing section 44. In addition, the schedule management section 45 controls the objective-function generating section 42, the iterative-improvement-algorithm executing section 43, and the genetic-algorithm executing section 44 so that the execution of the genetic algorithm by the genetic-algorithm executing section 44, the generation of a new third objective function by the objective-function generating section 42, and the execution of the iterative-improvement algorithm by the iterative-improvement-algorithm executing section 43 are repeatedly carried out according to the schedule.

It is to be noted that the functions of the above-mentioned initial-layout obtaining section 41, the objective-function generating section 42, the iterative-improvement-algorithm executing section 43, the genetic-algorithm executing section 44 and the schedule management section 45 are actually embodied as operation of the CPU 4 with a program stored on a storage medium, such as the hard disk 2 or the record medium 6A (thereinafter called "a optimal-solution determining program to a uniform-density layout problem"), by loading the program from the storage medium into the working storage 2 and by executing the program in the CPU 4.

The optimal-solution determining program, which is recorded on the record medium 6A such as a CD-ROM, is installed in the hard disk 2 of the computer. In other words, the storage medium such as the hard disk 2 and the record medium 6A is equivalent as a computer-readable storage medium according to the present invention, on which medium the optimal-solution determining program to a uniform-density layout problem is stored.

Thus, the optimal-solution determining apparatus 1 according to the present embodiment can be implemented in a common computing system (computer) including the above-mentioned hard disk 2, the working storage 3, the CPU 4, the display controller 5, the display 5A, the external storage device 6, the printer 7A, the print controller 7C, the input device 7B, the input controller 7D, the communication interface 9, and so on.

(2) Description of Operation of the Optimal-solution Determining Apparatus to Uniform-density Layout Problem According to the Embodiment of the Present Invention.

Figure 3:
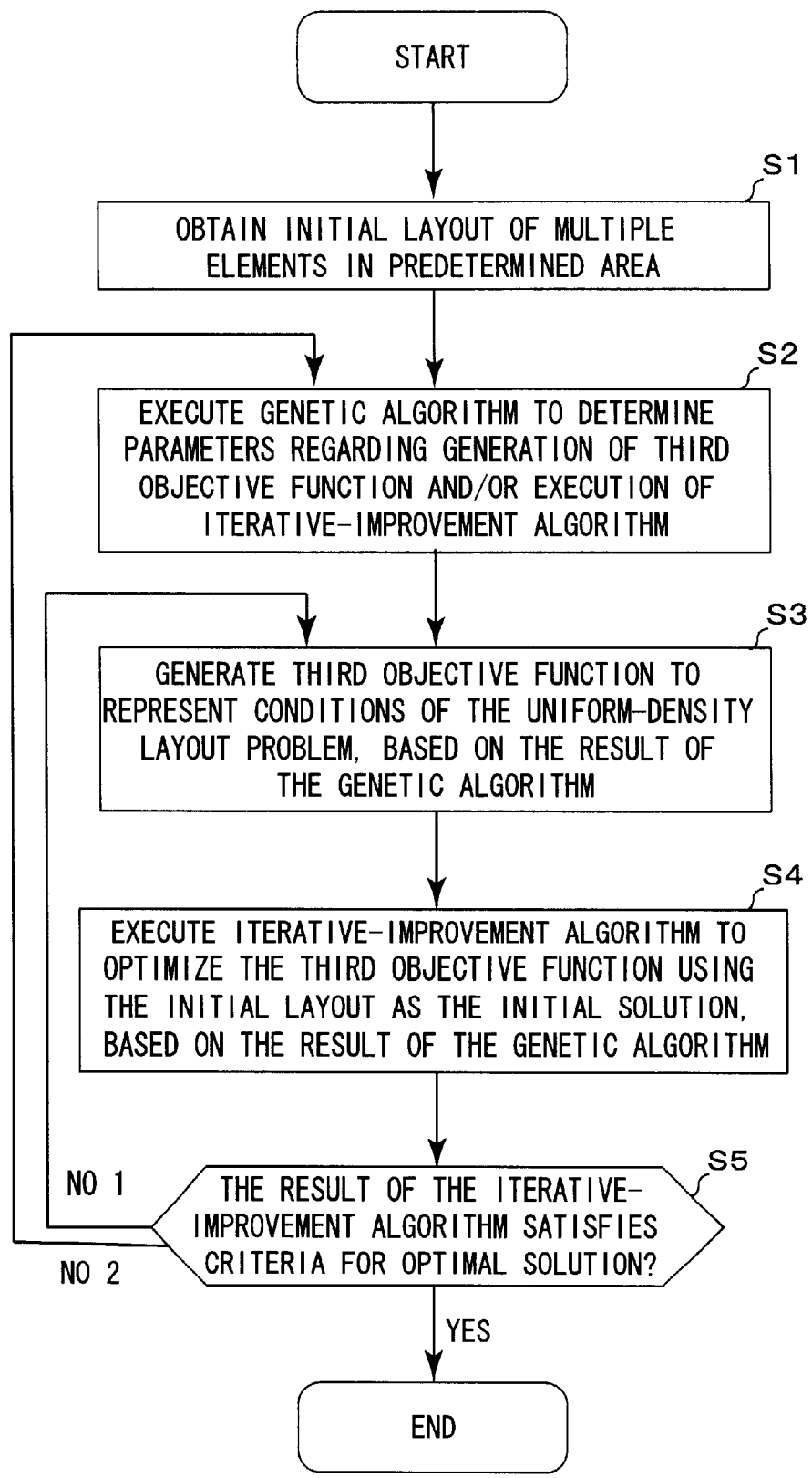
FIG. 3 is a flowchart showing a succession of procedural steps for determining an optimal solution to a uniform-density layout problem in the optimal-solution determining apparatus according to the embodiment (an optimal-solution determining method according to the embodiment)

The description will be first made on the general outlines of operation of the optimal-solution determining apparatus 1 according to the embodiment of the present invention with reference to the flowchart shown in FIG. 3.

A uniform-density layout problem being a subject of determination of the optimal solution is prepared as various data such as: data relating to multiple object elements which are to be arranged to form a layout; data relating to a layout region within which the multiple object elements are to be arranged; data relating to layout conditions under which the multiple object elements are to be arranged (the above-described items of data represent a layout problem which is the basis for the subject uniform-density layout problem); and data relating to a density-uniformalization condition.

In addition to these items of data, data relating to a first objective function is prepared. The first objective function is generated based on the layout problem being basis for the uniform-density layout problem and represents desirability of the layout solution to the layout problem. Specifically, the first objective function is formulated such that the resultant value of the first objective function from a layout solution decreases (or increases) as desirable the state as the layout solution satisfies the predetermined layout conditions of the layout problem.

The various data relating to the uniform-density layout problem can be inputted to the optimal-solution determining apparatus 1 in the form a data file via the external storage device 6, the hard disk 2, the communication interface 9 and the like. It is also possible that he operator of the present apparatus directly inputs the various data using the input device 7B.

When the optimal-solution determining apparatus 1 according to the present invention receives input of data on a uniform-density layout problem at the first, data of an initial layout of the multiple object elements relating to the given uniform-density layout problem is obtained by the initial-layout obtaining section 41 (an initial-layout obtaining step, S1).

Then, in the genetic-algorithm executing section 44, at least one of parameters relating to generation of a third objective function by the objective-function generating section 42 and parameters relating to execution of the iterative-improvement algorithm by the iterative-improvement-algorithm executing section 43 is represented as genes, and a genetic algorithm is executed on an initial population of individuals each of which has at least one chromosome being a string of the genes (a genetic-algorithm executing step, S2).

Upon conclusion of the genetic algorithm by the genetic-algorithm executing section 44, in the objective-function generating section 42, a linear combination of a first objective function, which represents the remaining conditions of the given uniform-density layout problem other than the density-uniformalization condition (the layout conditions of the layout problem), and a second objective function, which represents the density-uniformalization condition is generated as a third objective function, which is assumed to represent the layout conditions of the uniform-density layout problem, based on parameters represented by genes included in chromosomes of the individuals in the resultant population (an objective-function generating step, S3).

Next, in the iterative-improvement-algorithm executing section 43, the third objective function generated by the objective-function generating section 42 is optimized through the execution of the iterative-improvement algorithm on the third objective function using an initial layout obtained by the initial-layout obtaining section 41 as an initial solution, based on parameters represented by genes included in chromosomes of the individuals in the resultant population. And then, the third objective function is optimized so that a candidate for the optimal solution to the uniform-density layout problem is obtained (an iterative-improvement-algorithm executing step, S4).

Further, it is discriminated whether details of the execution of the iterative-improvement algorithm by the iterative-improvement-algorithm executing section 43 meets given criteria, and whether details of the optimal solution candidate obtained by the execution of the iterative-improvement algorithm meets given criteria (S5). When the details has been judged not to meet the corresponding criteria, the operation flow again shifts to the generation of the third objective function by the objective-function generating section 42 or the execution of the genetic algorithm by the genetic-algorithm executing section 44 so that another optimal solution candidate is searched for (NO1 route or NO2 route of S5) while, when the details has been judged to meet the corresponding criteria, the current optimal solution candidate is determined as the approximately optimal solution of the uniform-density layout problem (YES route of S5).

It is preferable that resultant data about the determined optimal solution to the uniform-density layout problem is displayed on the display 5A under control of the display controller 5, or is printed by the printer 7A under control of the print controller 7C. It is also preferable to store the resultant data in the external storage device 6 or the hard disk 2 as a data file, or to output the resultant data to the external network 9A via the communication interface 9.

Incidentially, the operator can manage the above-described operation of each component of the present apparatus as the need arises, by inputting desired instructions or necessary data using the input device 7B.

Properly speaking, prior to the beginning of the operation flow, the schedule management section 45 prepares a schedule for carrying out the above-mentioned operations (the obtainment of the initial layout by the initial-layout obtaining section 42, the execution of the genetic algorithm by the genetic-algorithm executing section 44, the generation of a new third objective function by the objective-function generating section 42, and the execution of the iterative-improvement algorithm by the iterative-improvement-algorithm executing section 43). And, after the operation flow has started, the schedule management section 45 controls the objective-function generating section 42, the iterative-improvement-algorithm executing section 43 and the genetic-algorithm executing section 44 so that the above-mentioned operations are repeatedly carried out according to the schedule.

As the general outlines of the operation of the optimal-solution determining apparatus 1 has been described above, detailed operation of each component of the optimal-solution determining apparatus 1 (the obtainment of the initial layout state by the initial-layout obtaining section 41, the execution of the genetic algorithm by the genetic-algorithm executing section 44, the generation of a new third objective function by the objective-function generating section 42, and the execution of the iterative-improvement algorithm by the iterative-improvement-algorithm executing section 43) will be described in the following.

It is to be noted that details of the execution of the genetic algorithm by the genetic-algorithm executing section 44, though actually performed immediately after the obtainment of the initial layout by the initial-layout obtaining section 41, will be described, for convenience of description, after the descriptions of the generation of a new third objective function by the objective-function generating section 42 and the execution of the iterative-improvement algorithm by the iterative-improvement-algorithm executing section 43 in the following.

It is also to be noted that details the preparation of the schedule and the control of other components by the schedule management section 45 will be described as occasions demands according to the description of the operation of the remaining components.

(2-1) Operation in the Initial-layout Obtaining Section.

The initial-layout obtaining section 41 obtains an initial layout of multiple object elements relating to the given uniform-density layout problem.

To put it concretely, the initial-layout obtaining section 41 first obtains data relating to the first objective function from various data relating to the given uniform-density layout problem, then acquires the optimal layout solution to the first objective function, and determines it as the initial layout of the uniform-density layout problem.

With this feature, since a layout appropriately reflecting the remaining layout conditions other than the density-uniformalization condition is obtained and used as an initial layout for the search of the optimal solution to the uniform-density layout problem, it is possible to improve the speed of and the efficiency in determining the optimal solution.

Preferably, the optimal layout solution to the first objective function can be acquired in the initial-layout obtaining section 41, by simply calculating from the first objective function or by executing a common iterative improvement algorithm or genetic algorithm on the first objective function. It is also preferable to have the optimal layout solution to the first objective function ready beforehand, for example, by carrying out such calculating or executing in any external computer, and to input as one of the data items relating to the first objective function. With the former feature, since the necessary input data relating to the uniform-density layout problem are simplified, it can be realized to automate a series of operations for determining the optimal solution to the given uniform-density layout problem. On the other hand, with the latter feature, since the configuration of the apparatus or program of the present invention is simplified, it is possible to reduce the cost for the present apparatus or program, and also possible to enhance the speed of the series of operations for determining the optimal solution.

It is to be noted that the initial layout of the multiple object elements is not limited to the optimal layout solution to the first objective function, but also can be obtained by using any other procedures, for example, by arranging the multiple object elements within the layout region at random. With this feature, according to the kind of the given uniform-density layout problem, it is possible to simplify the configuration of the present invention, and also possible to enhance the speed of the series of operations for determining the optimal solution.

(2—2) Operation in the Objective-function Generating Section.

The objective-function generating section 42 generates a linear combination of a first objective function, which represents the remaining conditions of the layout conditions of the uniform-density layout problem other than the density-uniformalization condition (layout conditions of the layout problem), and a second objective function, which represents the density-uniformalization condition, as a third objective function, which represents the layout conditions of the uniform-density layout problem.

To put it concretely, the objective-function generating section 42 first generates a second objective function, which represents the density-uniformalization condition of the given uniform-density layout problem. The second objective function is formulated such that its resultant value from a layout solution of the multiple object elements decreases (or increases) as desirable the state as the layout solution satisfies the density-uniformalization condition (that is, as uniform density as the multiple objects elements are distributed in according to the layout solution). In other words, such a function that decreases (or increases) as the density of the object elements comes uniform is selected and determined as the second objective function.

Then, the objective-function generating section 42 linearly combines the first objective function (an objective function representing the layout conditions of the layout problem), which has been inputted as one of data relating to the uniform-density layout problem, with the second objective function (an objective function representing the density-uniformalization condition), which has been obtained by the operation as described above, to thereby generate the third objective function, which represents the layout conditions of the uniform-density layout problem.

Assuming that the first objective function is expressed as Cost and that the second objective function is expressed as U, for example, the third objective function generated by the objective-function generating section 42 is represented as Cost+$\alpha$U, where $\alpha$ is a linear combination coefficient of the first objective function and the second objective function.

Preferably, the second objective function is generated by virtually laying out the multiple object elements in such a manner that the multiple object elements are distributed in substantially uniform density throughout the predetermined region. A procedure for making the virtual layout of the multiple object elements will be fully described in the following.

It is to be noted that in the following, for convenience of description, it is assumed to formulate the second objective function such that its resultant value from a layout solution the multiple object elements decreases as desirable the state as the layout solution satisfies the density-uniformalization condition (that is, as uniform density the multiple objects elements are distributed in according to the layout solution). The optimal solution is therefore assumed to minimize the second objective function.

At the first, the objective-function generating section 42 makes a virtual layout of the multiple object elements in the predetermined region in such a manner that the multiple object elements are distributed in substantially uniform density throughout the predetermined region, based on a current actual layout of the multiple object elements (current positions of the multiple object elements).

The current actual layout of the multiple object elements is either of 1) the initial layout of the multiple object elements obtained by the initial-layout obtaining section 41 and 2) the temporary layout of the multiple object elements at a timing defined in a schedule, which is prepared in advance by the schedule management section 45 as will be described later.

To give a specific example, it is assumed that the actual layout position of an object element a included in the uniform-density layout problem is defined by coordinates $(x_a, y_a)$. It is possible to imagine a virtual object element a' as a companion to the object element a for every object element. In the following description, such a virtual object element a', which corresponds to the actual object element a, is referred to as a "slot" for convenience.

The objective-function generating section 42 virtually arranges the individual slots a' within the layout region in such a manner that they're distributed in substantially uniform density, based on the coordinates $(x_a, y_a)$ of the actual layout position of the corresponding object elements a. And then it obtains coordinates $(x_{aslot}, y_{aslot})$ for the layout position of each of the slots a' as a virtual layout position of the corresponding object element a.

As a procedure for distributing the multiple slots corresponding to the multiple objects elements within the layout region in substantially uniform density, it is preferable to use the "packing procedure", which the inventors previously proposed (Japanese Patent Laid-Open Publication No. 2000-305920). In the present invention, the term "packing" means disposing slots within a given region in such a manner that the slots do not overlap with each other. Examples of the packing procedure are the following.

(A) Brick-laying Mode of Packing Procedure.

In this mode, the multiple slots are virtually disposed next to one another with respect to a vertex of the layout region, based on the actual layout positions of the corresponding multiple object elements.

Figure 4A:
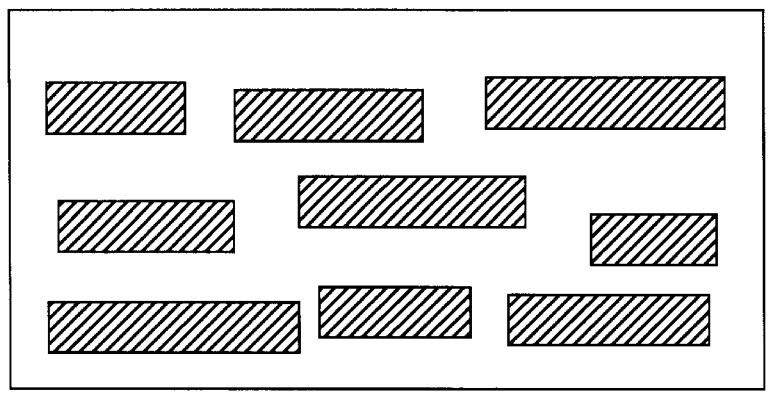
FIGS. 4(A) and 4(B) are diagrams both illustrating a brick-laying mode of packing procedure carried out in the embodiment.
Figure 4B:
Figure 4B:
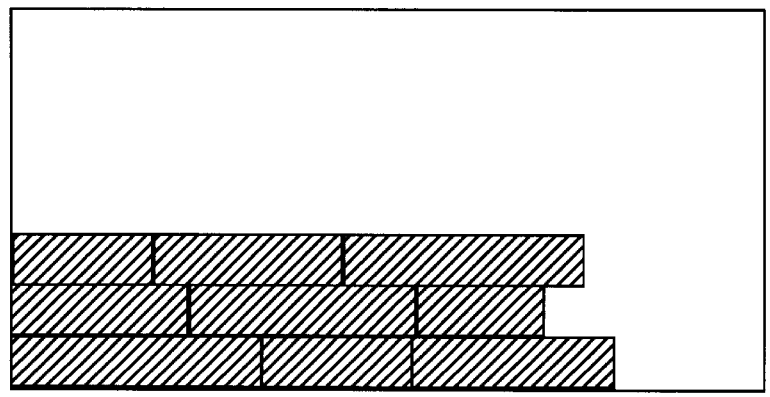

It is assumed that, for example, the multiple objects elements have actual layout positions as shown in FIG. 4(A). For determining coordinates of the slots corresponding to these object elements, as shown in FIG. 4(B), the slot corresponding to the lowermost leftmost object element in the layout region is first disposed with respect to the lower left vertex of the layout region. And then, the slots corresponding to the other lowermost object elements are juxtaposed in order from left to right with respect to the next-previously disposed slot. When the slot corresponding to the lowermost rightmost object element in the layout region has been disposed, the slots corresponding to the second lowermost object elements are then disposed on the already disposed slots in a like manner. The similar operation is repeated until there is no object element whose companion slot has not yet been disposed in the layout region.

Put it in another way, in the brick-laying mode, the multiple object elements are virtually disposed next to one another with respect to a vertex of the predetermined region so as to arrange the multiple object elements in the virtual layout.

In the meantime, on performing the packing, it is preferable to previously put the multiple slots serial numbers and to dispose the multiple slots according to the serial numbers so that a newly disposed slot does not overlap with any of the slots that have been already disposed. The serial numbers for the multiple objects elements are determined based on relationship between the actual layout positions of the multiple objects elements. Specifically, based on the relationship, several conditions are first established such that a total width of the slots which is to be juxtaposed in a line must not exceed the width of the layout region and the like, and the order of disposing the slots corresponding to the object elements is then determined under the conditions.

(B) Tetoris Mode of Packing Procedure.

This is an enhanced version of the brick-laying mode. In this mode, the sizes of the slots are considered in advance so that the disposed slots have a relatively smooth outline without considerable projections or depressions at the conclusion of the packing.

Figure 5A:
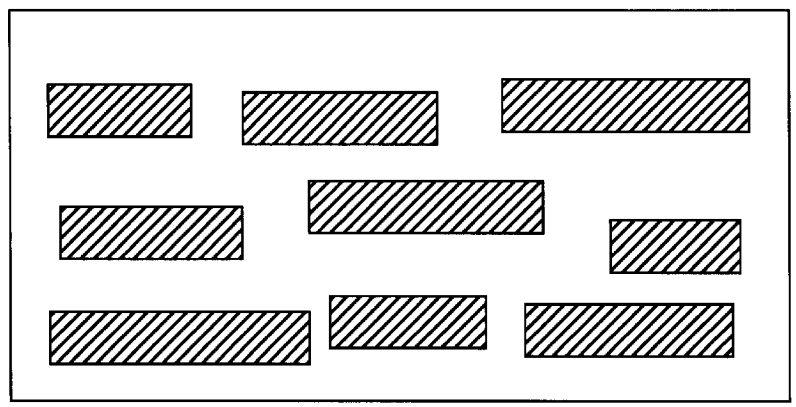
FIGS. 5(A) and 5(B) are diagrams both illustrating a Tetoris mode of packing procedure carried out in the embodiment.
Figure 5A:
Figure 5B:
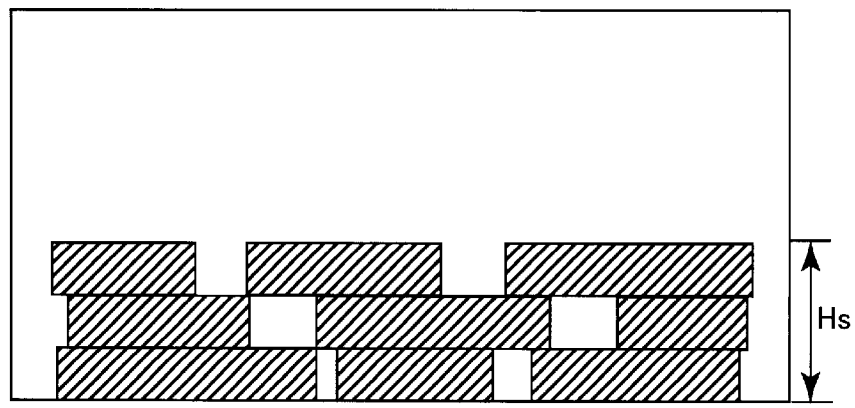

It is assumed that, for example, the multiple objects elements have actual layout positions as shown in FIG. 5(A). For determining coordinates of the slots corresponding to these object elements, one of the sides of the layout region is first selected (the base is selected in FIG. 5(A)) as a reference line with respect to which the slots are disposed, and a standard height Hs for piling up the slots is determined. Next, according to a predetermined order of disposing the slots, as shown in FIG. 5(B), the slots are disposed one by one with respect to the selected side of the layout region so as to be piled up on top of one another, until a total height of a column of the piled slots reaches the standard height Hs. Then, on a side contiguous to the column of the already piled slots (the right side is selected in FIG. 5(A)), the remaining slots are newly disposed one by one in a like manner, until a total height of a column of the newly piled slots reaches the standard height Hs. When columns of the disposed slots almost reach the right side of the layout region, the remaining slots are newly disposed one by one on the leftmost column of the already piled slots layout region so as not to overlap with the already piled slots, then on the second leftmost column, and in a like manner. The similar operation is repeated until there remains no slot that has not yet been disposed in the layout region.

Put it in another way, in the Tetoris mode, the multiple object elements are virtually disposed next to one another with respect to a side of the predetermined region so as to arrange the multiple object elements in said virtual layout.

The order of disposing the slots is determined based on the relationship between the actual layout positions of the object elements corresponding to the slots, as is the case of the brick-laying mode. Specifically, in the same way as described above for the brick-laying mode, several conditions are first established such that, when the slots are to be piled up in columns from left to right, the rightmost column of the piled slots must not exceed the rightside of the layout region and the like, and the disposing order is then determined under the conditions.

(C) Gathering Mode of Packing Procedure.

In this mode, an appropriate position in the layout region is selected as a center, and the slots are gathered around the center.

Figure 6A:
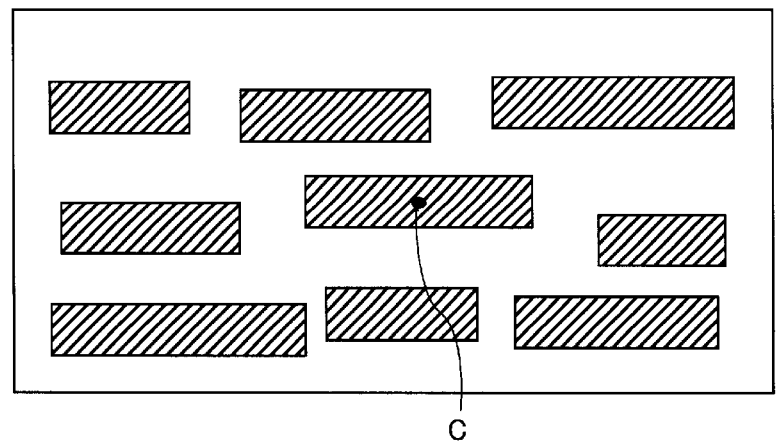
FIGS. 6(A) and 6(B) are diagrams both illustrating a gathering mode of packing procedure carried out in the embodiment.
Figure 6B:
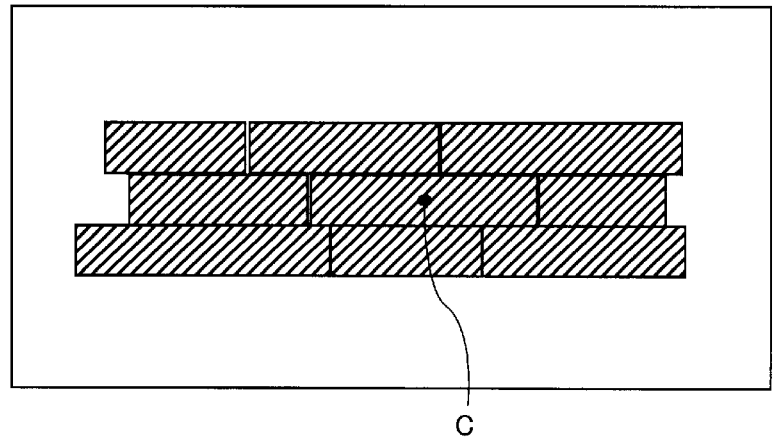

It is assumed that, for example, the multiple objects elements have actual layout positions as shown in FIG. 6(A). For determining coordinates of the slots corresponding to these object elements, a position in the layout region is selected and determined as the center of packing C. Next, according to a predetermined order of disposing the slots, as shown in FIG. 6(B), the slots are disposed one by one with respect to the center of packing C in such a manner that a newly disposed slot does not overlap with any of the slots that have been already disposed multiple slots, until there remains no slot that has not yet been disposed in the layout region.

Put it in another way, in the gathering mode, the multiple object elements are virtually disposed next to one another with respect to a center of the predetermined region so as to arrange the multiple object elements in the virtual layout.

The order of disposing the slots is determined as follows. Firstly, the actual layout of the object elements corresponding to the slots is set in a polar coordinate system whose origin point is the center of packing C, so that the actual layout position of each of the object elements is defined by polar coordinates (r, θ). Then, serial numbers are put to the slots in ascending order of the radius coordinates r of the corresponding object elements and, when any plural object elements have the same radius coordinates r, in ascending order of the angle coordinates θ.

(D) Scattering Mode of Packing Procedure.

This mode is a peripheral packing procedure, contrarily to the gathering mode. Namely, the slots are scattered substantially evenly along the sides of the layout region, not gathered about a point in the layout region.

Figure 7A:
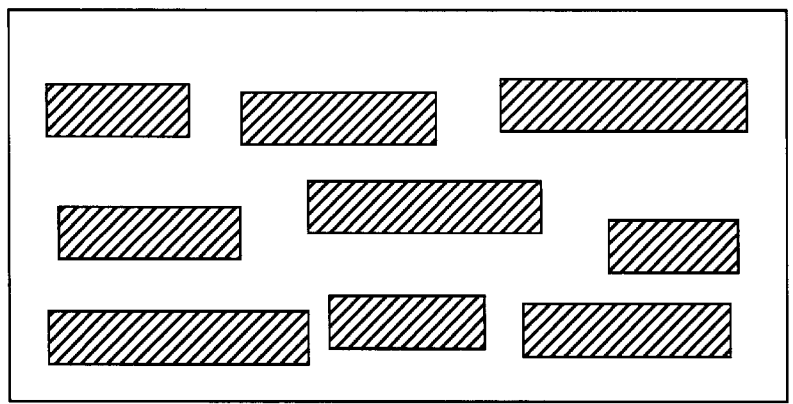
FIGS. 7(A) and 7(B) are diagrams both illustrating a scattering mode of packing procedure carried out in the embodiment.
Figure 7A:
Figure 7B:
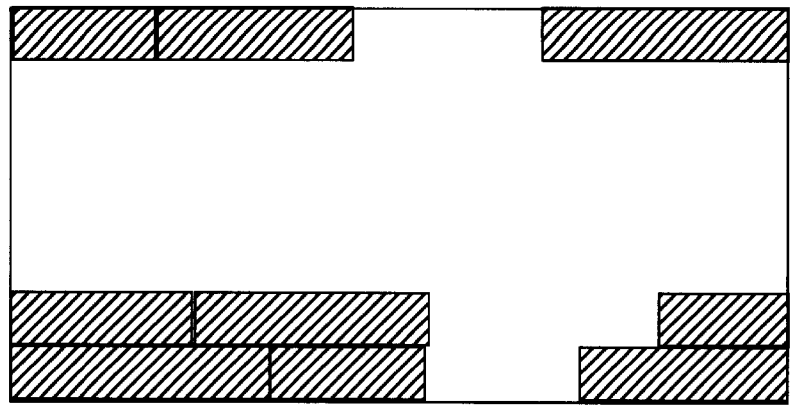

It is assumed that, for example, the multiple objects elements have actual layout positions as shown in FIG. 7(A). For determining coordinates of the slots corresponding to these object elements, according to a predetermined order of disposing the slots, the slots are disposed one by one to an alternately selected one of corners (or vertices) of the layout region. In FIG. 7(B), the first slot is disposed to, and arranged along, the lower left corner of the layout region, for example, then the second slot is along the lower right corner, and the like. When a slot is newly disposed to the corner along which any slots have been already arranged, the newly disposed slot is arranged side by side with the already disposed slots along the outline of the layout region.

Put it in another way, in the scattering mode, the multiple object elements are virtually disposed next to one another with respect to an alternately selected one of vertices of the predetermined region so as to arrange the multiple object elements in said virtual layout.

The order of disposing the slots is determined as follows. Firstly, the actual layout of the object elements corresponding to the slots is set in a rectangular coordinate system, so that the actual layout position of each of the object elements is defined by rectangular coordinate (x, y). Next, a series of numbers (first serial numbers) is put one to one of the slots in ascending order of the x-coordinate, and another series of numbers (second serial numbers) is also put one to one of the slots in ascending order of the y-coordinate. These first and second serial numbers for each slot are referred to as $O_x$ and $O_y$, respectively.

Then, the packing of the slots is carried out according to the following four rules.

D1: the slot corresponding to the object element which has the smallest values of both $O_x$ and $O_y$ is disposed to the lower left corner of the layout region.

D2: the slot corresponding to the object element which has the largest values of both $O_x$ and $O_y$ is disposed to the upper right corner of the layout region.

D3: the slot corresponding to the object element which has the largest value of $O_x$ and the smallest value of $O_y$ is disposed to the lower right corner of the layout region.

D4: the slot corresponding to the object element which has the smallest value of $O_x$ and the largest value of $O_y$ is disposed to the upper left corner of the layout region.

For example, according to the rule D1, the object element $C_{ij}$, which is foremost among all of the object elements in both of the orders $O_x$ and $O_y$, is selected and the slot corresponding to the object element $C_{ij}$ is arranged along the lower left corner of the layout region, and the object element $C_{ij}$ is removed from both of the orders $O_x$ and $O_y$. Next, according to the rule D2, the slot corresponding to the object element $C_{k1}$, which is rearmost among the remaining object elements in both of the orders $O_x$ and $O_y$, is arranged along the upper right corner of the layout region, and the object element $C_{k1}$ is removed from both of the orders $O_x$ and $O_y$. Further, according to the rule D3, the slot corresponding to the object element $C_{mn}$, which is rearmost in the order $O_x$ and foremost in the order $O_y$ among the remaining object elements, is arranged along the lower right corner of the layout region, and the object element $C_{mn}$ is removed from both of the orders $O_x$ and $O_y$. Likewise, according to the rule D4, an appropriate object element is selected, the corresponding slot is arranged, and the selected object element is removed from the orders $O_x$ and $O_y$. The remaining slots are disposed one by one to the alternatively selected corner in a like manner, and arranged side by side with the already disposed slots along the outline of the layout region so as not to overlap with the already disposed slots. The similar operation is repeated until there remains no slot that has not yet been disposed in the layout region.

Then, the packing of the slots is carried out according to the following four rules.

Naturally, rules for selecting the object elements one by one (rules for selecting the slots one by one) does not limited to the above-described order and combination (D1, D2, D3, D4), but may take an arbitrary order or arbitrary combination.

To sum up, the objective-function generating section 42 selects an appropriate mode of packing procedure is selected from the above-described four modes, and makes the virtual layout of the multiple object elements using the selected mode of packing procedure. With this feature, it is possible to make a virtual layout of the multiple object elements in substantially uniform density according to a simple and clear procedure. In addition, since several modes of virtual-layout procedure (packing procedure) are prepared, it is possible to make a virtual layout in various manners and, by combining the scheduling method described later, to improve the speed of and the efficiency in determining the optimal solution.

In the meantime, the layout region mostly has any sub-region in which an actual layout of the object elements is to be prohibited (layout-prohibited subregion). It is therefore preferable that when making a virtual layout of the object elements using the packing procedure, the slots are arranged outside such a layout-prohibited subregion. For this purpose, the objective-function generating section 42 arranges outside such a layout-prohibited subregion, using the following procedures.

(a) Skipping Procedure

In this procedure, if any slot is arranged in (or partly in) the layout-prohibited subregion, the slot is skipped over the layout-prohibited subregion so as to be rearranged outside the layout-prohibited subregion.

Figure 8A:
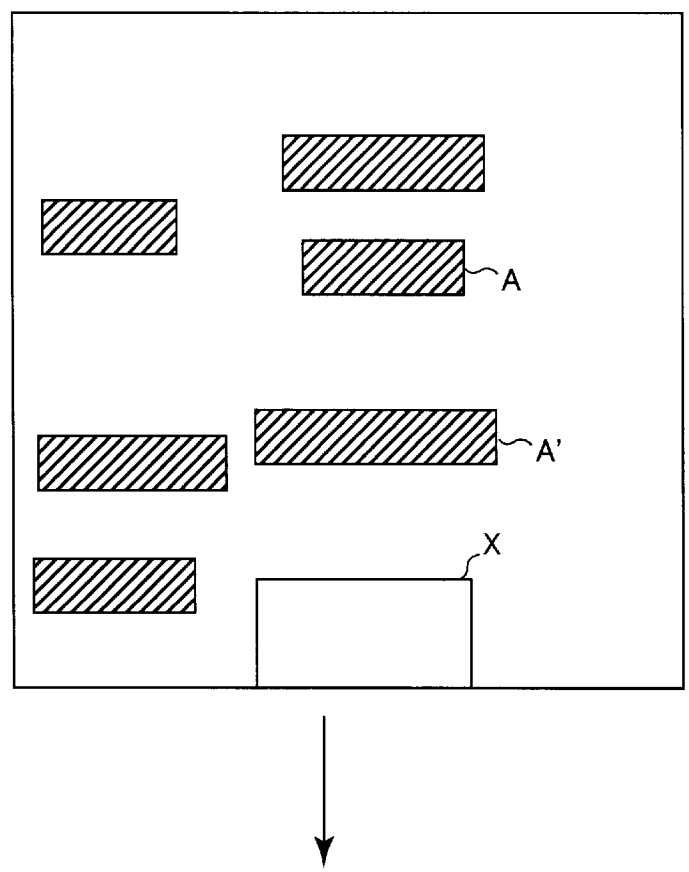
FIGS. 8(A) and 8(B) are diagrams both illustrating an example of a procedure for skipping a layout-prohibited subregion during the packing carried out in the embodiment.
Figure 8B:
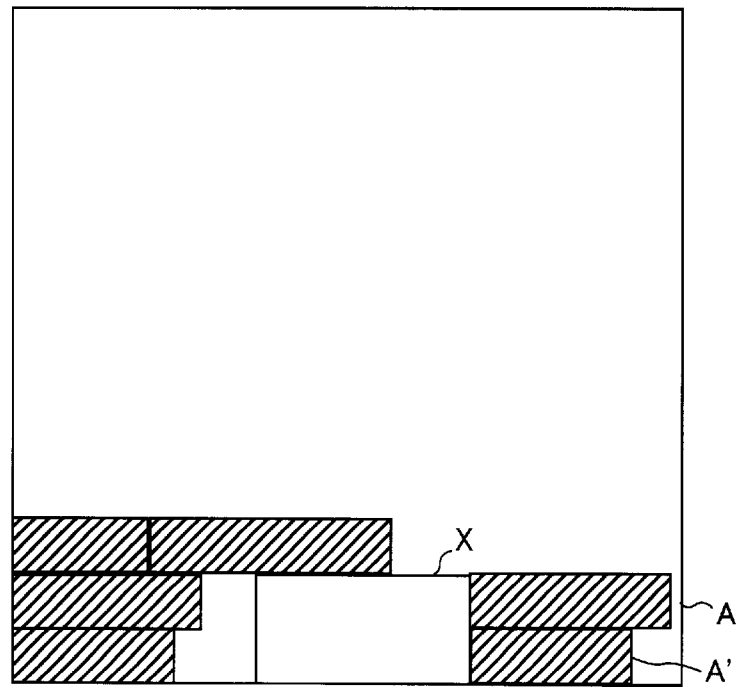

For example, it is assumed that the layout region has the layout-prohibited subregion X, as shown in FIG. 8(A), and that the packing of the slots corresponding to the object elements is carried out according to the brick-laying mode of packing procedure. The slots A and A', which would be arranged in the layout-prohibited subregion if normally according to the brick-laying mode, as shown in FIG. 8(B), are skipped over the layout-prohibited subregion to arranged outside (in FIG. 8(B), the right side of) the layout-prohibited subregion.

Put it in another way, in the skipping procedure, if the predetermined region has any local subregion in which an actual layout of the multiple object elements is to be prohibited, the multiple object elements are skipped over the local subregion while the multiple object elements are arranged in the predetermined region in the virtual layout.

(b) Pushing-out Procedure 1

In the following three procedures, if any slot is arranged in (or partly in) the layout-prohibited subregion, the slot is shifted outwardly (pushed out) off the layout-prohibited subregion so as to be rearranged outside the layout-prohibited subregion.

In the first pushing-out procedure, the slot is shifted in such a direction that a distance between a current actual position of the object element corresponding to the slot and the position of the slot after shifted is minimal, so that the slot is rearranged outside the layout-prohibited subregion with a minimum distance shift.

Figure 9A:
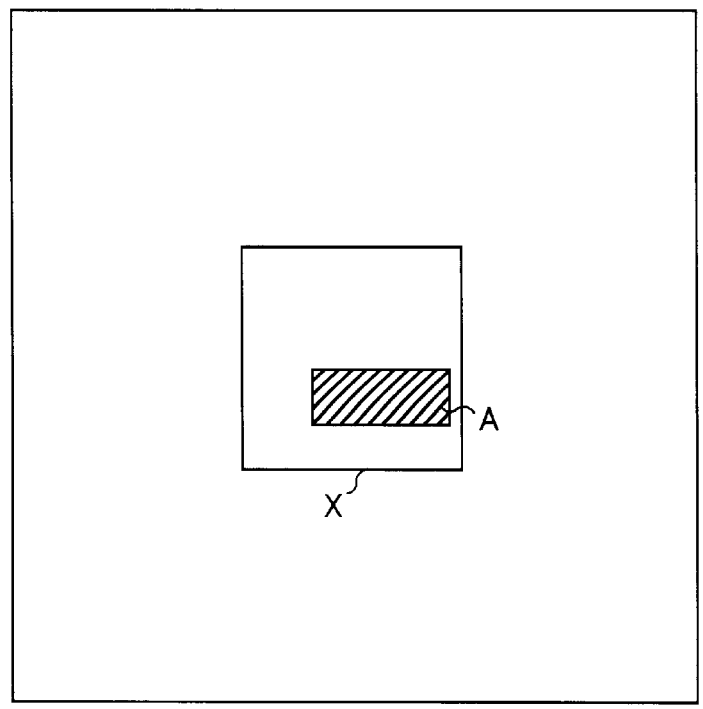
FIGS. 9(A) and 9(B) are diagrams both illustrating another example of the skipping procedure in the embodiment.
Figure 9B:
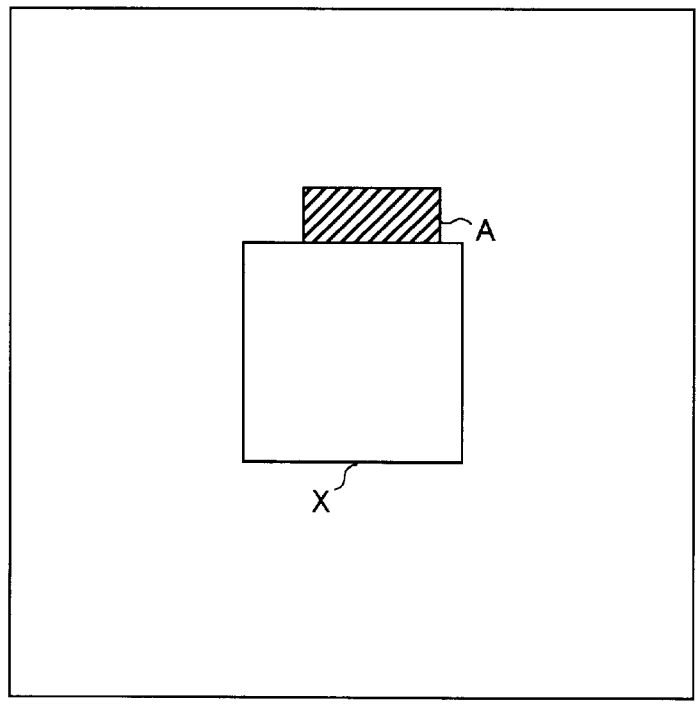

For example, it is assumed that, as shown in FIG. 9(A), the layout region has the layout-prohibited subregion X and that the slot A has been disposed within the layout-prohibited subregion X by the packing procedure. If the object element corresponding to the slot A is positioned in the upper part of the layout region in the actual layout, as shown in FIG. 9(B), the slot A is shifted upwardly off the layout-prohibited subregion X in such a direction that a distance between the rearranged position of the slot and the current actual position of the corresponding object element is minimal.

Put it in another way, in the first pushing-out procedure, if the predetermined region has any local subregion in which an actual layout of the multiple object elements is to be prohibited and if any one of the multiple object elements is placed in a virtual position to overlap the local subregion while the multiple object elements are arranged in the virtual layout, the virtual position of the one element is shifted outwardly off the local subregion in such a direction that a distance between a current actual position of said one element and the shifted virtual position of said one element is minimal.

(c) Pushing-out Procedure 2

In the second pushing-out procedure, if the layout-prohibited subregion is adjacent to the outline of the layout region, the slot is shifted in such a direction that a distance between the outline of the layout-prohibited subregion and the outline of the layout region is maximal, so that the slot is rearranged outside the layout region without lying off the outline of the layout region.

Figure 10A:
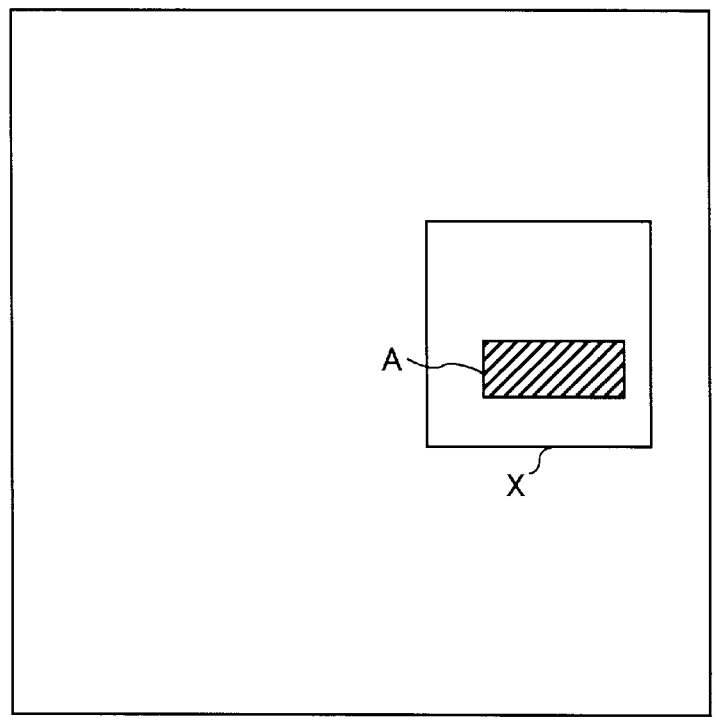
FIGS. 10(A) and 10(B) are diagrams both illustrating a further example of the skipping procedure in the embodiment.
Figure 10A:
Figure 10B:
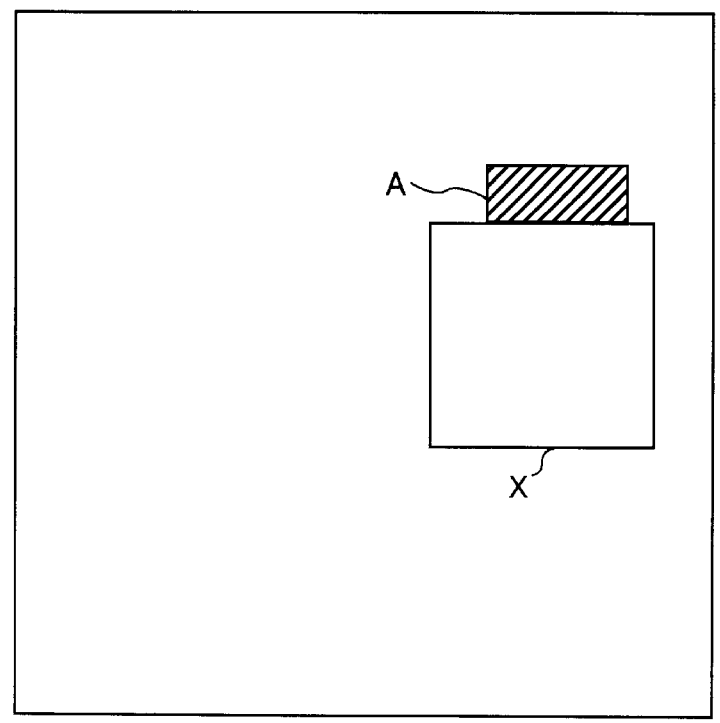

For example, it is assumed that, as shown in FIG. 10(A), the layout region has the layout-prohibited subregion X and that the slot A has been disposed within the layout-prohibited subregion X by the packing procedure. The right side of the layout-prohibited subregion X is so adjacent to the outline of the layout region that if the slot A were shifted rightward off the layout region, the slot A would lie off the outline of the layout region. Thus, such a direction is previously determined that the outline of the layout-prohibited subregion X is relatively away from the outline of the layout region (in FIG. 10(B), the upper side of the layout-prohibited subregion X) and, as shown in FIG. 10(B), the slot A is shifted off the layout-prohibited subregion X in a direction toward the predetermined part of the outline.

Put it in another way, in the second pushing-out procedure, if the predetermined region has any local subregion in which an actual layout of the multiple object elements is to be prohibited and if any one of the multiple object elements is placed in a virtual position to overlap said local subregion while the multiple object elements are arranged in said virtual layout, said virtual position of said one element is shifted outwardly off said local subregion in such a direction that a distance between an outline of the local subregion and an outline of the predetermined region is maximal.

(d) Pushing-out Procedure 3

In the third pushing-out procedure, with consideration given to the position of the slot in the layout-prohibited subregion, such a direction is determined that a distance between the slot and the outline of the layout-prohibited subregion be minimal, and the slot is shifted off in the determined direction, so that the slot is rearranged outside the layout-prohibited subregion.

Figure 11A:
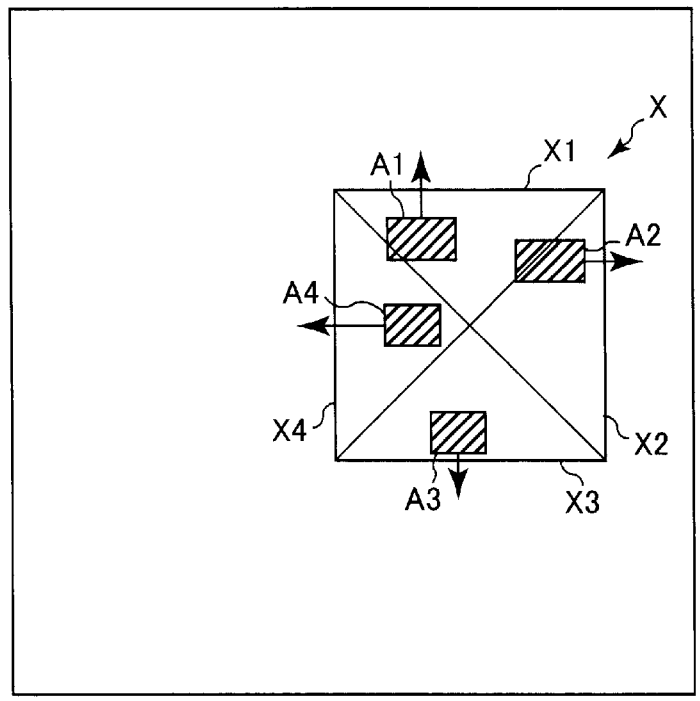
FIGS. 11(A) and 11(B) are diagrams both illustrating an additional example of the skipping procedure in the embodiment.
Figure 11B:
Figure 11B:
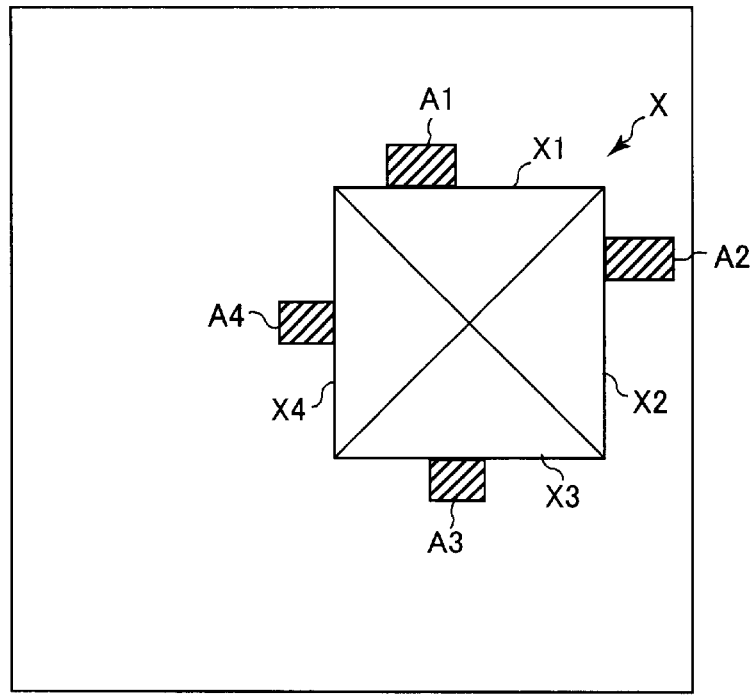

For example, it is assumed that, as shown in FIG. 11(A), the layout region has the layout-prohibited subregion X and that the slots A1, A2, A3, A4 has been disposed within the layout-prohibited subregion X by the packing procedure. If the layout-prohibited subregion X has the rectangle shape as shown in FIG. 11(A), the layout-prohibited subregion X is divided by its diagonal lines into four triangles X1, X2, X3, X4, as shown in FIG. 11(B), and each of the slots A1, A2, A3, A4, which are positioned in the triangles X1, X2, X3, X4 respectively, is shifted off in such a direction that a distance of shifting of the position of each slot is minimal (in FIG. 11(B), each of the slots A1, A2, A3, A4 is shifted toward the side of the layout-prohibited subregion X which is shared with a side of the corresponding triangle X1, X2, X3, X4).

Put it in another way, in the third pushing-out procedure, if the predetermined region has any local subregion in which an actual layout of the multiple object elements is to be prohibited and if any one of the multiple object elements is placed in a virtual position to overlap the local subregion while the multiple object elements are arranged in the virtual layout, the virtual position of said one element is shifted outwardly off the local subregion in such a direction that a distance of shifting of the virtual position of the one element is minimal.

To put it concisely, if any object element has been virtually laid out in any local subregion in which an actual layout of the multiple object elements is to be prohibited (layout-prohibited subregion), the objective-function generating section 42 rearranges the multiple object elements outside the layout-prohibited subregion using one appropriately selected from the above-described procedures. With this feature, even if the layout region has any layout-prohibited subregion, it is possible to virtually arranging the multiple object elements with avoiding the layout-prohibited subregion according to a simple and clear procedure.

Next, the objective-function generating section 42 generates a function which represents a relationship between the layout of the multiple slots (namely, the virtual layout of the multiple object elements), obtained by using the above-described packing procedure, and the current actual layout of the multiple object elements as the second objective function.

Specifically, the second objective function, which represents the density-uniformalization condition, is formulated in such a manner as to have the minimum value when the coordinates ($x_a$, $y_a$) for the layout position of an object element a are equivalent to the coordinates ($x_{a \cdot slot}$, $y_{a \cdot slot}$) for the layout position of the corresponding slot (namely, when $x_a = x_{a \cdot slot}$ and $y_a = y_{a \cdot slot}$), assuming that the layout positions of the object elements are constant. In other words, the second objective function is minimized when the coordinates for the layout position of every object element are equivalent to the coordinates for the layout position of the corresponding slot. Thus, using the relationship between the actual layout positions of the object elements and the layout positions of the corresponding slots (virtual layout positions of the object elements), it is possible to effectively represent the density-uniformalization condition with a quite simple arrangement.

As a procedure for generating the second objective function, it is also preferable to use, in addition to the above-described procedure (the procedure for making a virtual layout of the multiple object elements so that the multiple object elements is distributed in substantially uniform density), other several kinds of procedures based on the current actual layout of the object elements, which procedures will be described in the following.

(I) Procedure for Generating a Function Relating to Population Density of the Object Elements.

Figure 12A:
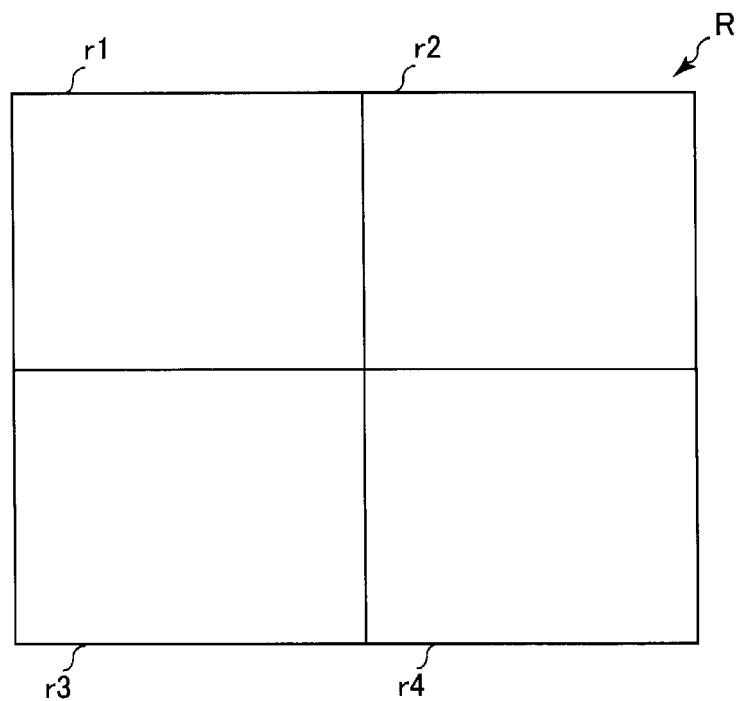
FIGS. 12(A) and 12(B) are diagrams both illustrating a procedure for generating a function relating to density (population) of the object elements in the embodiment.

In this procedure, as shown in FIG. 12(A), the layout region R is divided into appropriate subregions r1, r2, r3, r4.

Figure 12B:
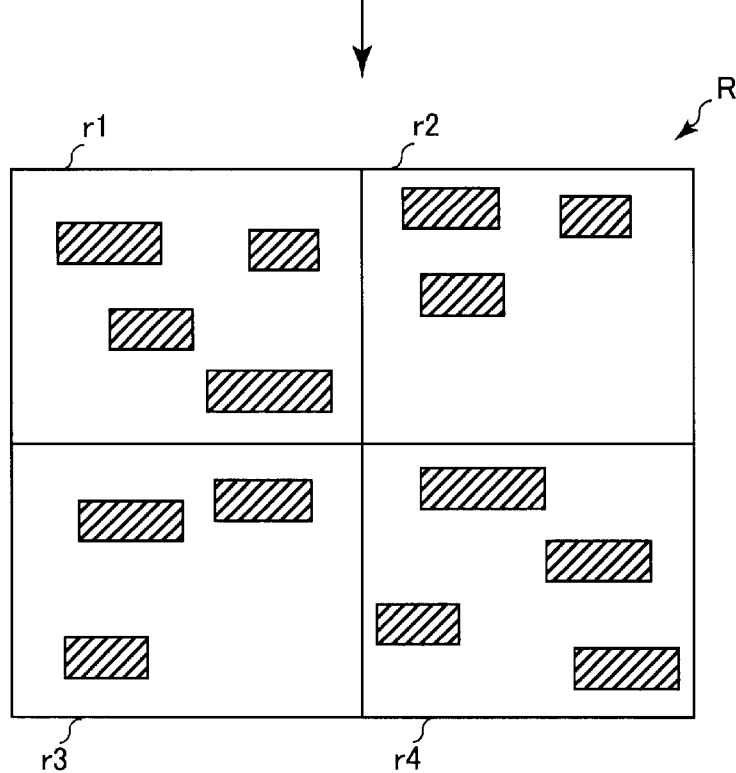

Then, as shown in FIG. 12(B), the number N of the object elements positioned in each of the subregion r1, r2, r3, r4 is calculated.

Next, a threshold value Nc is set appropriately and a function u is defined for each subregion as following.

$$\text{if } N > Nc, \; u = N - Nc \quad (1)$$

$$\text{if } N \leq Nc, \; u = 0 \quad (2)$$

Then, the functions u defined for the individual subregions are totalized for all the subregions, and the resultant function U, which relates to population density of the object elements, is determined as the second objective function.

Put it in another way, a function relating to density of the multiple object elements is generated as the second objective function according to this procedure. With this arrangement, especially when the number of the object elements is relatively small and the areas of the object elements are generally even, it is possible to effectively generate the second objective function.

(II) Procedure for Generating a Function Relating to Area Density of the Object Elements.

Figure 13:
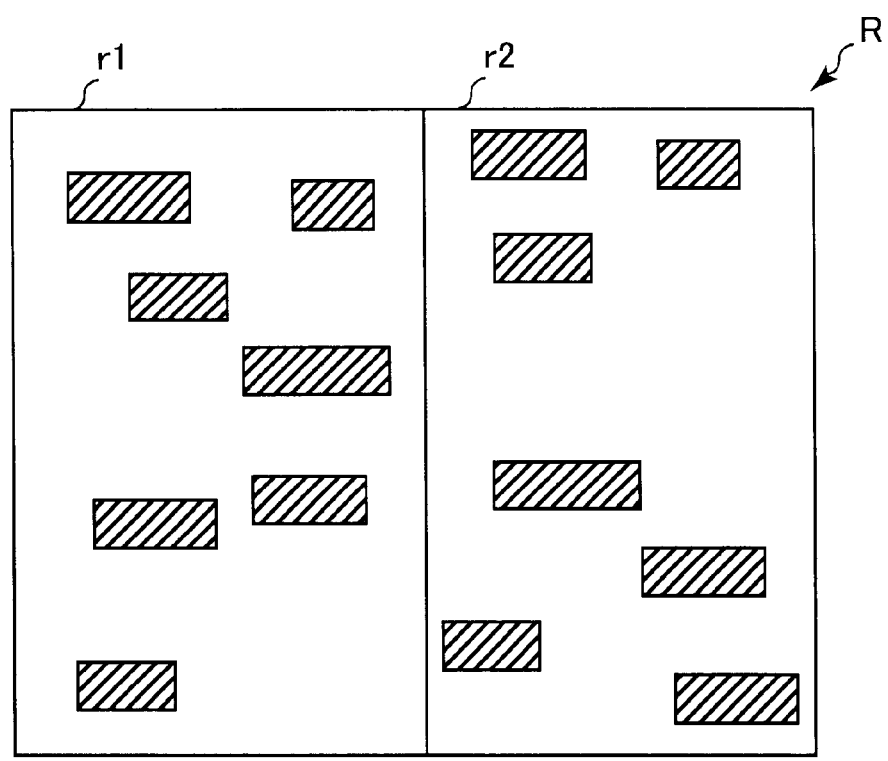
FIG. 13 is a diagram illustrating a procedure for generating a function relating to area density of the object elements in the embodiment.

In this procedure, as shown in FIG. 13, instead of the population density of the object elements, the total area A of the object elements positioned in each of the subregion r1, r2 is calculated.

Next, a threshold value Ac is set appropriately and a function u is defined for each subregion as following.

$$\text{if } A > Ac, \; u = A - Ac \quad (3)$$

$$\text{if } A \leq Ac, \; u = 0 \quad (4)$$

Then, the functions u defined for the individual subregions are totalized for all the subregions, and the resultant function U, which relates to area density of the object elements, is determined as the second objective function.

Put it in another way, a function relating to area density of the multiple object elements is generated as the second objective function according to this procedure. With this arrangement, especially when the number of the object elements is relatively small while the areas of the object elements vary greatly, it is possible to effectively generate the second objective function.

(III) Procedure for Generating a Function Relating to the Number of Overlaps between Any Two of the Object Elements.

Figure 14:
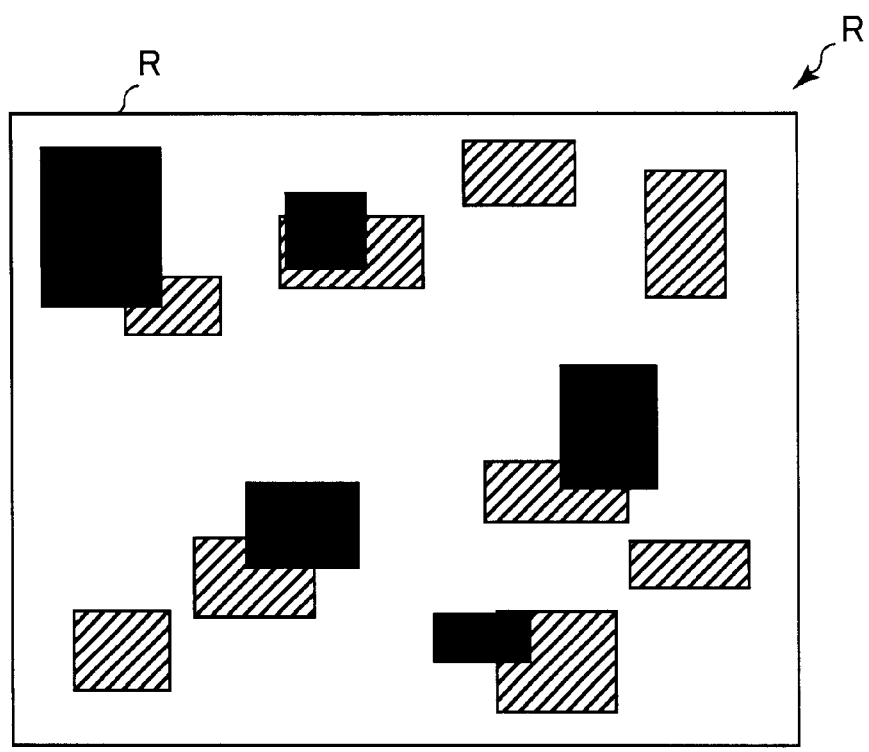
FIG. 14 is a diagram illustrating a procedure for generating a function relating to the number of overlaps between any of the object elements in the embodiment.

In this procedure, as shown in FIG. 14, the number of object elements positioned in the layout region R and overlapping with each other (the number of object elements designated by the black rectangles in FIG. 14) is calculated, and the resultant function U, which relates to the number of overlaps of object elements, is determined as the second objective function.

Put it in another way, a function relating to the number of overlaps between any two or more of the multiple object elements is generated as the second objective function according to this procedure. With this arrangement, especially when there are so many object elements that are likely to overlap with each other while the areas of the object elements are relatively even, it is possible to effectively generate the second objective function.

(IV) Procedure for Generating a Function Relating to the Total Area of Overlaps between Any Two of the Object Elements.

Figure 15:
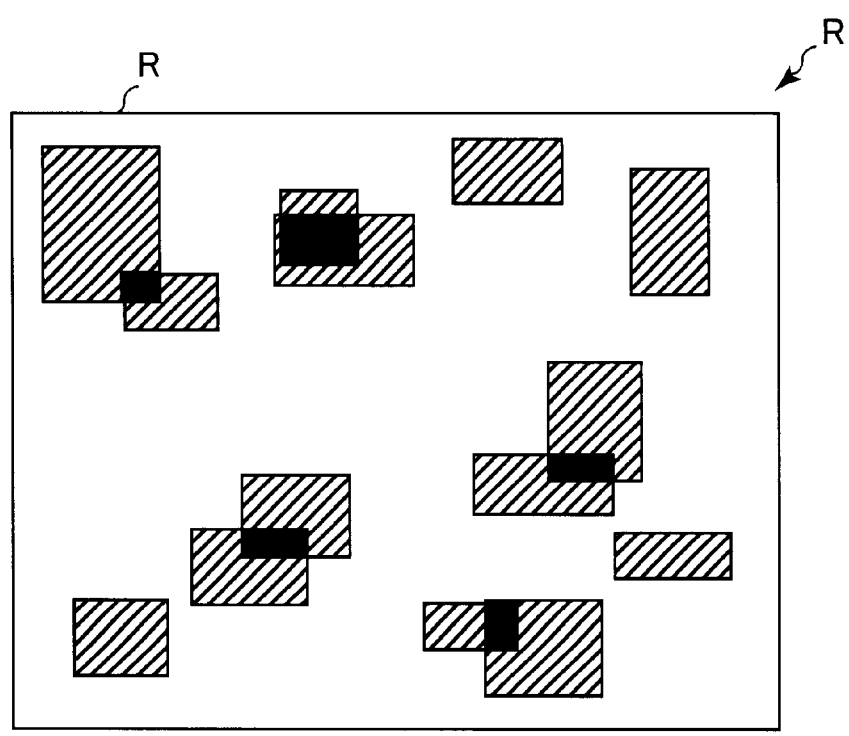
FIG. 15 is a diagram illustrating a procedure for generating a function relating to the total area of overlaps between any of the object elements in the embodiment.

In this procedure, as shown in FIG. 15, the total area of object elements positioned in the layout region R and overlapping with each other (the total area of object elements designated by the black rectangles in FIG. 15) is calculated, and the resultant function U, which relates to the total area of overlaps of object elements, is determined as the second objective function. For simplifying the calculation, areas of overlaps between any two or more object elements are calculated only once for each overlap, and the calculated areas are totalized.

Put it in another way, a function relating to the total area of overlaps between any two or more of the multiple object elements is generated as the second objective function according to this procedure. With this arrangement, especially when there are so many object elements that are likely to overlap with each other and the areas of the object elements vary greatly, it is possible to effectively generate the second objective function.

To sum up, the objective-function generating section 42 generates a linear combination of a first objective function, which represents the second set of conditions of the layout problem, and a second objective function, which represents the density-uniformalization condition of the uniform-density layout problem, as a third objective function, which is assumed to represent the first set of conditions of the first layout problem. With this configuration, using a simple function (second objective function) appropriately reflecting the density-uniformalization condition, it is possible to easily generate a simple objective function (third objective function) representing the uniform-density layout problem, so that the speed of and the efficiency in determining the optimal solution is further improved.

It is noted that actually the objective-function generating section 42 carries out the above-described operation of generating the third objective function according to a schedule prepared and administered by the schedule management section 45.

(2-3) Operation in the Iterative-improvement-algorithm Executing Section.

The iterative-improvement-algorithm executing section 43 executes an iterative-improvement algorithm using the initial layout obtained by the initial-layout obtaining section 41 as an initial solution so as to optimize the third objective function generated by the objective-function generating section 42, thereby obtaining a layout solution being a candidate for a optimal solution to the uniform-density layout problem.

The third objective function generated by the objective-function generating section 42 is generally a function of the coordinates for the layout positions of the individual object elements and the sizes of the individual object elements (if the individual object elements have rectangle shapes, the sizes may be defined by the heights and widths). As the sizes of the individual object elements have constant values in most instances, the coordinates for the layout positions of the individual object elements are the only variables included in the third objective function.

Like the forementioned example, it is assumed the third objective function is represented as Cost+αU (where Cost is the first objective function, U is the second objective function, α is the linear combination coefficient of the first objective function and the second objective function). Also assuming that the parameter α is constant, the only variables included in the third objective function Cost+αU is the coordinates for the layout positions of the individual object elements, so that it is possible to optimize the third objective function Cost+αU (in other words, to search for the optimal solution that minimizes the third objective function Cost+αU) by executing a common iterative-improvement algorithm using the initial layout of the multiple object elements obtained by the initial-layout obtaining section 41 as an initial layout solution, Thus, the iterative-improvement-algorithm executing section 43 executes a common iterative-improvement algorithm using the initial layout of the multiple object elements obtained by the initial-layout obtaining section 41 as the initial layout solution, and optimizes the third objective function Cost+αU, which includes the coordinate values for the layout positions of the individual object elements as variables.

In the meantime, when the optimal solution to the first objective function is used as the initial layout, the initial layout naturally has optimality to the layout conditions of the layout problem (the remaining conditions of the uniform-density layout problem other than the density-uniformalization condition), and it is therefore desired to search effectively for a new layout solution that reflects the density-uniformalization condition, without considerable loss of the optimality of the initial layout.

Figure 16:
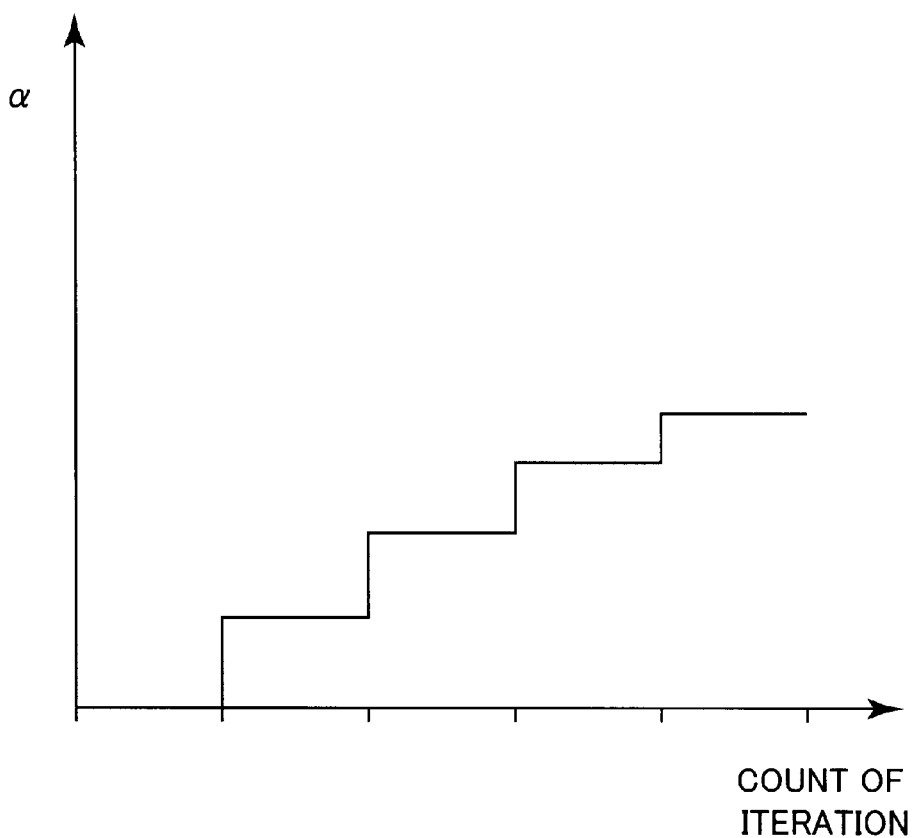
FIG. 16 is a diagram illustrating a relationship between iteration counts of an iterative-improvement algorithm and values of the parameter $\alpha$ in the embodiment.

Thus, as shown in FIG. 16, the iterative-improvement-algorithm executing section 43 sets a small positive value as the initial-value to the parameter α of the third objective function Cost+αU at the beginning of the iterative-improvement algorithm, and then gradually increases the value of the parameter α as a count of iteration in the iterative-improvement algorithm increases.

By varying the value of the parameter α in such a manner, since the initial layout is gradually affected by the density-uniformalization condition bit by bit, it is possible to effectively search for the optimal solution without the wasteful loss of the initial layout's natural optimality to the layout conditions of the layout problem. Especially, when the packing procedure is used for generating the second objective function and when the actual layout positions for the individual object elements are very distant from the layout positions for the corresponding slots, the layout of the slots takes effect gradually, not suddenly, to the layout of the object elements, so that the efficient search for the optimal solution is realized.

Incidentially, in special cases, the third objective function Cost+αU can be decompositied into a function of x-coordinate values and a function of y-coordinate values of the individual object elements.

$$\text{Cost}=\text{Cost}_x(x_1, x_2, \ldots, x_n)+\text{Cost}_y(y_1, y_2, \ldots, y_n) \quad (5)$$

$$U=U_x(x_1, x_2, \ldots, x_n)+U_y(y_1, y_2, \ldots, y_n) \quad (6)$$

In such cases, with giving separate parameters $\alpha_x$ and $\alpha_y$ for either of x-coordinate and y-coordinate, the third objective function Cost+αU can be decomposed as following.

$$\text{Cost}+\alpha U=(\text{Cost}_x+\alpha_x U_x)+(\text{Cost}_y+\alpha_y U_y) \quad (7)$$

It is preferable to vary the values of the parameters $\alpha$, $\alpha_x$, $\alpha_y$ for every iteration count of the iterative-improvement algorithm. Values of the parameters $\alpha$, $\alpha_x$, $\alpha_y$ at the time that the iteration count of the iterative-improvement algorithm is i are expressed as following.

$$\alpha=\alpha(i, \beta_1, \beta_2, \ldots, \beta_n) \quad (8)$$

$$\alpha_x=\alpha_x(i, \beta_{x1}, \beta_{x2}, \ldots, \beta_{xn}) \quad (9)$$

$$\alpha_y=\alpha_y(i, \beta_{y1}, \beta_{y2}, \ldots, \beta_{yn}) \quad (10)$$

where $\beta_1, \beta_2, \ldots, \beta_n, \beta_{x1}, \beta_{x2}, \ldots, \beta_{xn}, \beta_{y1}, \beta_{y2}, \ldots, \beta_{yn}$ are new parameters defining the values of the parameters $\alpha$, $\alpha_x$, $\alpha_y$ at the iteration count i of the iterative-improvement algorithm.

These parameters will be used later in the description about operation of the genetic-algorithm executing section 44.

After executing the iterative-improvement algorithm in the above-described manner, the iterative-improvement-algorithm executing section 43 discriminates whether details of the executed iterative-improvement algorithm satisfies given criteria, and also discriminates whether details of the obtained layout solution, which is a candidate for an optimal solution, satisfies given criteria.

Specifically, as the details of the executed iterative-improvement algorithm, first values such as the current iteration count of the iterative-improvement algorithm and the variation of the parameter α, and, as the details of the obtained layout solution, second values such as the resultant value of the third objective function from the obtained layout solution are each compared with the corresponding criteria.

Then, if both the first and second values have been judged to meet the corresponding criteria, the iterative-improvement-algorithm executing section 43 determines the obtained optimal solution as the optimal solution (strictly, an approximately optimal solution) to the uniform-density layout problem.

On the other hand, if either of the first and second values have been judged not to meet the corresponding criteria, the operation flow shifts back to the execution of the genetic algorithm by the genetic-algorithm executing section 44 or the generation of the third objective function by the objective-function generating section 42 so as to search for another optimal solution candidate. The shift of the operation flow is controlled according to a predetermined schedule prepared by the schedule management section 45.

(2-4) Operations of the Schedule Management Section (Part 1).

The schedule management section 45 prepares a schedule relating to the generation of the third objective function by the objective-function generating section 42 and the execution of the iterative-improvement algorithm by the iterative-improvement-algorithm executing section 43, prior to the generation of the third objective function by the objective-function generating section 42.

In addition, the schedule management section 45 controls the objective-function generating section 42 and the iterative-improvement-algorithm executing section 43 so that the generation of the third objective function and the execution of the iterative-improvement algorithm are repeatedly carried out according to the schedule.

In other words, conditions for shifting the flow to NO1 route of S5 in FIG. 3 are established by the schedule management section 45.

Specifically, to take a example of the case that the objective-function generating section 42 uses the packing procedure for generating the second objective function, the schedule management section 45 first prepares a schedule relating to both the generation of the third objective function (the execution of the packing procedure) by the objective-function generating section 42 and the execution of the iterative-improvement algorithm by the iterative-improvement-algorithm executing section 43, prior to the generation of the third objective function by the objective-function generating section 42.

It is preferable that the schedule is inputted to the present apparatus as data together with the various data relating to the uniform-density layout problem, or automatically generated in the schedule management section 45 based on the various data on the uniform-density layout problem inputted to the present apparatus. With the former feature, since the necessary input data relating to the uniform-density layout problem are simplified, it can be realized to automate a series of operations for determining the optimal solution to the given uniform-density layout problem. On the other hand, with the latter feature, since the configuration of the apparatus or program of the present invention is simplified, it is possible to reduce the cost for the present apparatus or program, and also possible to enhance the speed of the series of operations for determining the optimal solution.

The details of the schedule are represented as criteria for deciding timings on which, and conditions under which, the operation flow shifts to the execution of the packing procedure and the generation of the third objective function by the objective-function generating section 42 during the execution of the iterative-improvement algorithm by the iterative-improvement-algorithm executing section 43. For example, it is represented as criteria such that a count of iteration (iteration count) of the iterative-improvement algorithm reaches a predetermined constraint, the operation flow shifts to the execution of the packing procedure and the generation of the third objective function by the objective-function generating section 42 and the like.

Then, according to the prepared schedule, the schedule management section 45 controls the objective-function generating section 42 so that when a iteration count of the iterative-improvement algorithm by the iterative-improvement-algorithm executing section 43 reaches a predetermined value, the objective-function generating section 42 carries out the packing of the slots using the specified packing procedure so as to generate a new second objective function, and by extension a new third objective function.

Then, the schedule management section 45 controls the iterative-improvement-algorithm executing section 43 to execute the iterative-improvement algorithm again, using the newly generated third objective function.

After the generation of the objective function by the objective-function generating section 42 and the execution of the iterative-improvement algorithm by the iterative-improvement-algorithm executing section 43 are repeated, it is discriminated whether a iteration count of the iterative-improvement algorithm executed by the iterative-improvement-algorithm executing section 43 meets a given criterion, and also whether the obtained layout solution, which is a candidate for an optimal solution, meets a given criterion.

When the iterative-improvement-algorithm executing section 43 or the schedule management section 45 has judged that either of the generation of the objective function and the iteration count of the iterative-improvement algorithm satisfies the corresponding criterion, the current layout solution being a candidate for the optimal solution is determined as the approximately optimal solution.

As described above, the schedule prepared by the schedule management section 45 defines the timing on which the operation flow shifts to the execution of the packing procedure by the objective-function generating section 42. Examples of the timing are following.

(a) Procedure for Carrying out the Packing Only once.

Figure 17A:
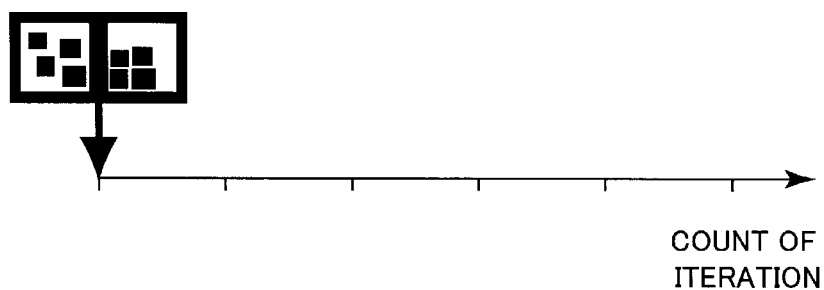
FIGS. 17(A), 17(B) and 17(C) are diagrams all illustrating a relationship between iteration counts of the iterative-improvement algorithm and timings of the packing in the embodiment.

In this procedure, as shown in FIG. 17(A), the packing of the slots is carried out only once, based on the initial layout of the multiple object elements. The operation flow does not shift to NO1 route of S5 in FIG. 3, so that the coordinates for the individual slots (and the second objective function) do not change thereafter. The iterative improvement of the layout solution through the iterative-improvement algorithm is continued until the optimal solution candidate obtained by the iterative-improvement algorithm satisfies given criteria for the optimal solution.

To put it in another way, the objective-function generating step arranges the multiple object elements in the virtual layout based on the initial layout of the multiple object elements.

(b) Procedure for Carrying out the Packing on Fixed Timing.

Figure 17B:
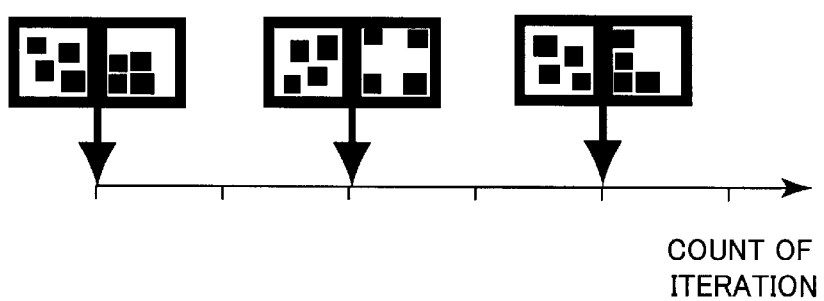

In this procedure, as shown in FIG. 17(B), during the execution of the iterative-improvement algorithm, the packing of the slots is carried out on fixed timings defined in the schedule. On this account, a criterion for the iteration count or the execution time of the iterative-improvement algorithm is defined in the schedule, and the iteration count or the execution time of the iterative-improvement algorithm is kept observed during the execution of the iterative-improvement algorithm at S4 in FIG. 3. When the iteration count or the execution time exceeds the predetermined criteria defined in the schedule, the operation flow shifts to NO1 route of S5 in FIG. 3. Then, according to the details defined in the schedule, in the objective-function generating section 42, re-packing of the slots, generation of a new second objective function and generation of a new third objective function are carried out, based on the layout positions of the object elements in the current layout solution at that time.

The generation of a new objective function by the objective-function generating section 42 and the execution of the iterative-improvement algorithm by the iterative-improvement-algorithm executing section 43 are repeated and, for each predetermined number of repetition times, it is discriminated whether the iteration count or the execution time of the iterative-improvement algorithm meets the corresponding criterion defined in the schedule. When the iteration count or the execution time of the iterative-improvement algorithm is judged to meet the corresponding criterion, or when the current layout solution is judged to meet the criteria for the optimal solution, the repetition is completed.

To put it in another way, the objective-function generating step arranges the multiple object elements in the virtual layout at each of one or more scheduled occasions in accordance with the predetermined schedule, based on the current actual layout of the multiple object elements in the iterative-improvement-algorithm executing step for each of the occasions.

(c) Procedure for Carrying out the Packing on Random Timing.

Figure 17C:
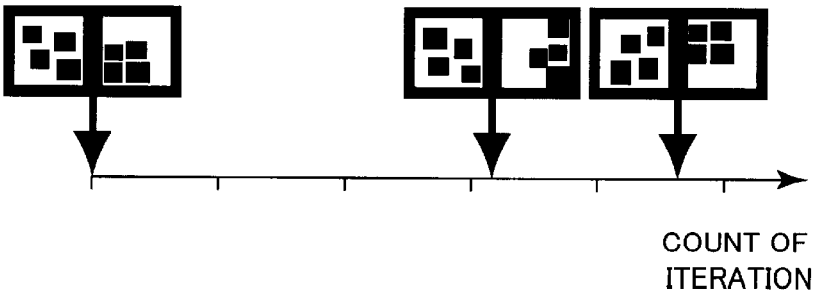

In this procedure, as shown in FIG. 17(C), the packing of the slots is carried out on random timings during the execution of the iterative-improvement algorithm. On this account, the schedule includes triggers determined using a random-number generation program so that the operation flow shifts to the objective-function generating step with a predetermined frequency for every fixed number of the iteration count or for every fixed length of the execution time of the iterative-improvement algorithm. The iterative-improvement-algorithm executing section 43 outputs a trigger on a random timing, the operation flow shifts to NO1 route of S5 in FIG. 3, and according to the details of the schedule, the objective-function generating section 42 carries out the re-packing of slots, the generation a new second objective function and the generation of a new third objective function, based on the layout positions of the object elements in the current layout solution.

The generation of latest objective functions by the objective-function generating section 42 and the execution of a iterative-improvement algorithm by the iterative-improvement-algorithm executing section 43 are repeatedly carried and, for each predetermined number of repetition times, it is discriminated whether the iteration count or the execution time of the iterative-improvement algorithm meets the corresponding criterion defined in the schedule. When the iteration count or the execution time of the iterative-improvement algorithm is judged to meet the corresponding criterion, or when the current layout solution is judged to meet the criteria for the optimal solution, the repetition is completed.

To put it in another way, the objective-function generating step arranges the multiple object elements in the virtual layout at each of one or more random occasions, based on the current actual layout of the multiple object elements in the iterative-improvement-algorithm executing step for each of the occasions.

In the above-described (b) procedure for carrying out the packing on a fixed timing and (c) procedure for carrying out the packing on a random timing, the packing of the slots is carried out plural times. It is preferable to use the same mode of procedure for all the packings, and use the different modes of procedures for each of the packings. With the former feature, since the necessary input data relating to the uniform-density layout problem are simplified, it can be realized to automate a series of operations for determining the optimal solution to the given uniform-density layout problem. On the other hand, with the latter feature, since it is possible to prevent the biased distribution of the slots resulting from the use of a single mode of packing procedure, so that the non-uniformity of object elements is reduced efficiently.

In addition to the above-dencribed examples, it is also preferable that the schedule management section 45 controls the objective-function generating section 42 to carry out the generation of a new second objective function according to the schedule using a procedure other than the packing procedure, or using any one selected from plural kinds of procedures.

Thereafter, the schedule management section 45 controls the objective-function generating section 42 to generate a new third objective function, with varying the coefficients of the linear combination of the first objective function and the second objective function according to the schedule.

As described above, the objective-function generating step carries out the generating of a new third objective function at each of plural scheduled occasions in accordance with the predetermined schedule, while at least one of 1) a coefficient of the linear combination of the first and second objective functions and 2) a definition of the second objective function varies for each of the occasions. With this feature, since it is possible to adjust the extent to which the density-uniformalization condition participate is reflected in the third objective function, the slots are prevented from the biased distribution resulting from the difference of the mode of packing procedure, so that the optimal solution can be determined efficiently.

(2-5) Operation in the Genetic-algorithm Executing Section.

The genetic-algorithm executing section 44 represents a group of parameters relating to the generation of a new third objective function by the objective-function generating section 42 and a group of parameters relating to the execution of the iterative-improvement algorithm by the iterative-improvement-algorithm executing section 43 as genes, and executes a genetic algorithm on an initial population of individuals each of which has at least one chromosome being a string of the genes.

It is to be noted that this operation is actually carried out immediately after the obtainment of the initial layout by the initial-layout obtaining section 41, as described above.

In the following, the procedure for generating chromosomes will be described first.

The genetic-algorithm executing section 44 represents parameters relating to the generation of a new third objective function by the objective-function generating section 42 and parameters relating to the execution of the iterative-improvement algorithm by the iterative-improvement-algorithm executing section 43 as genes, and generates chromosomes each being a string of the genes.

In other words, the genetic-algorithm executing section 44 codes values of parameters regarding the second objective function $U(U_x, U_y)$, which has been combined into the third objective function in order to reduce the density-uniformalization condition of the object elements, and values of parameters regarding the schedule defining timings of the individual steps as genes, and generates chromosomes each being a linear string of the genes.

Specifically, the genetic-algorithm executing section 44 generates the following types of chromosomes.

Chrom-1

Figure 18A:
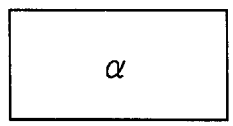
FIGS. 18(A), 18(B), 18(C), 18(D), 18(E) and 18(F) are diagrams all illustrating structures of various types of chromosomes used for executing a genetic algorithm in the embodiment.

This type of chromosome has genes each composed of a parameter $\alpha$, as shown in FIG. 18(A). Assuming that the third objective function is expressed as $Cost+\alpha U$ where Cost is the first objective function and U is the second objective function, a coefficient $\alpha$ is represented as the parameter by the individual genes of the chromosome Chrom-1.

Chrom-2

Figure 18B:
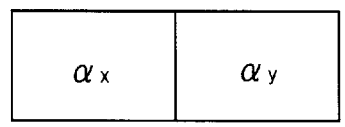

This type of chromosome has genes each composed of parameters $\alpha_x$ and $\alpha_y$, as shown in FIG. 18(B). Assuming that the first objective function Cost and the second objective function U are decomposed as $Cost_x+Cost_y$ and $U_x+U_y$, respectively, where $Cost_x$ and $U_x$ are functions of x-coordinates of the object elements and $Cost_y$ and $U_y$ are functions of y-coordinates of the object elements, and that the third objective function is expressed as $(Cost_x+\alpha_x U_x)+(Cost_y+\alpha_y U_y)$, coefficients $\alpha_x$ and $\alpha_y$ are represented as the parameters by the genes of the chromosome Chrom-2.

Chrom-M

Figure 18C:
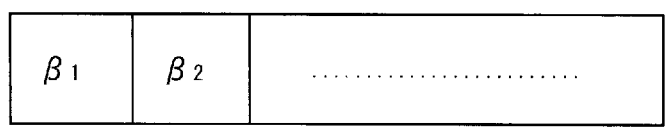

This type of chromosome has genes each composed of parameters $\beta_1, \beta_2, \ldots, \beta_n$, as shown in FIG. 18(C). Assuming that the coefficient $\alpha$ is expressed as a function of a current iteration count of the iterative-improvement algorithm with coefficients $\beta_1, \beta_2, \ldots, \beta_n$, the coefficients $\beta_1, \beta_2, \ldots, \beta_n$ are represented as the parameters by the genes of the chromosome Chrom-M.

Chrom-2M

Figure 18D:
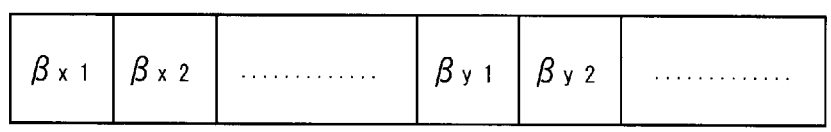

This type of chromosome has genes each composed of parameters $\beta_{x1}, \beta_{x2}, \ldots, \beta_{xn}$ and $\beta_{y1}, \beta_{y2}, \ldots, \beta_{yn}$, as shown in FIG. 18(D). Assuming that the coefficient $\alpha_x$ is expressed as a function of a current iteration count of the iterative-improvement algorithm with coefficients $\beta_{x1}, \beta_{x2}, \ldots, \beta_{xn}$, and that the coefficient $\alpha_y$ is expressed as a function of a current iteration count of the iterative-improvement algorithm with coefficients $\beta_{y1}, \beta_{y2}, \ldots, \beta_{yn}$, the coefficients $\beta_{x1}, \beta_{x2}, \ldots, \beta_{xn}$ and $\beta_{y1}, \beta_{y2}, \ldots, \beta_{yn}$, are represented as the parameters by the genes of the chromosome Chrom-2M.

In the genetic-algorithm executing step, the above-described types of chromosomes are generated. In other words, the genetic-algorithm executing step has a feature that one or more coefficients relating to the third objective function generated in the objective-function generating step are represented as genes, and that the chromosome of each individual is generated using the genes.

Chrom-S

Figure 18E:
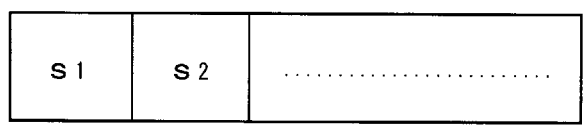

This type of chromosome has genes each composed of the parameters $s_1, s_2, \ldots, s_n$, which relating to the details of the packing of the slots (the timing of carrying out the packing, the kind of packing procedure, and the like), as shown in FIG. 18(E). In other words, parameters relating to the schedule, which defines the execution of operations of the present invention, are represented by genes and the chromosome of each individual is generated using the genes.

Chrom-I

Figure 18F:
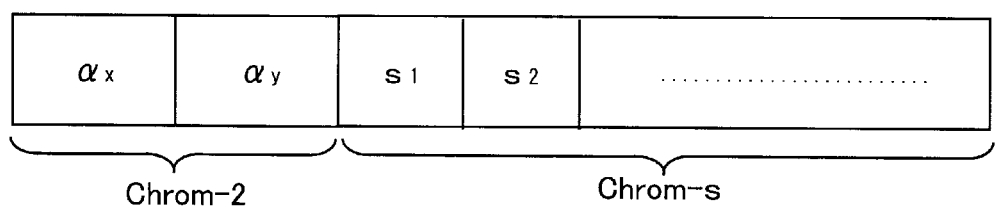

This type of chromosome is a combination of a chromosome of the type Chrom-1, Chrom-2, Chrom-M or Chrom-2M and a chromosome of the type Chrom-S, as shown in FIG. 18(F) (the combination of chromosomes of the types Chrom-2 and Chrom-S is shown in FIG. 18(F)). In other words, both of 1) coefficients relating to the third objective function generated in the objective-function generating step and 2) parameters relating to the schedule defining timings of the steps are represented by genes, and the chromosome of each individual is generated using the genes.

By generating the various types of chromosomes as described above, it is possible to determine the parameters relating to the objective function (third objective function) or the parameters relating to the execution of the individual steps appropriately according to details of the uniform-density with high speed, so that the speed of and the efficiency in determining the optimal solution is further improved.

Moreover, since chromosomes are composed of genes not representing the coordinates for the object elements of the uniform-density layout problem but representing the parameters of the third objective function, it is possible to make the length of the individual chromosome relatively short independently of the size of the problem, so that the effective search of the optimal solution is realized using the genetic algorithm.

Next, genetic operations carried out on chromosomes are described in the following.

First, as one of the genetic operations carried out on chromosomes, crossover is described.

Exchanging Crossover

Figure 19:
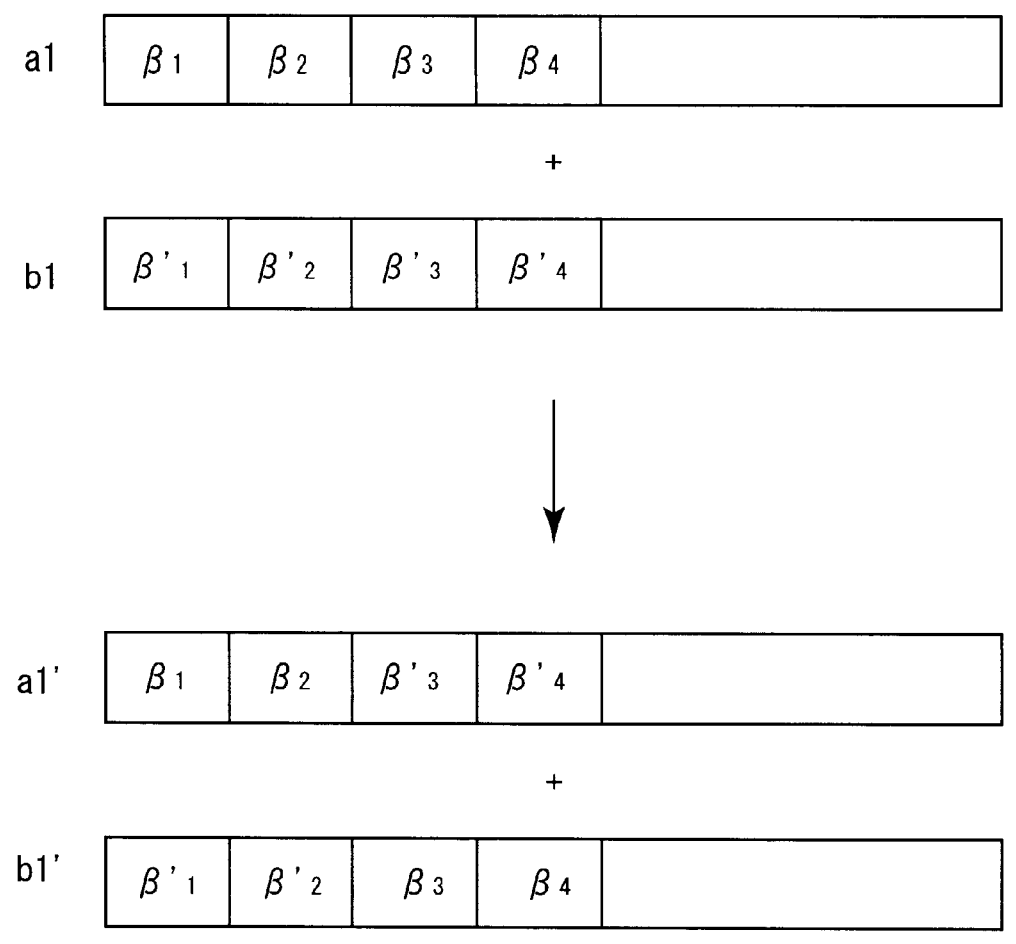

In this kind of crossover, as shown in FIG. 19, a pair of individuals are selected as parents, and parts of their chromosomes $a_1, b_1$ are exchanged with each other, so that new chromosomes $a_1', b_1'$ are created for a new pair of individuals as the children. According to the exchanging crossover, it is possible to preserve the genes of parents while creating various combinations of the genes for children with simple operations.

Weighting Crossover

Figure 20:
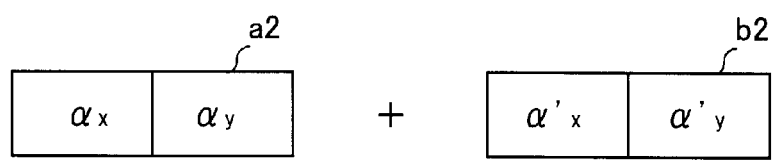
FIG. 20 is a diagram illustrating a weighting crossover performed during the genetic algorithm in the embodiment.
Figure 20:
Figure 20:
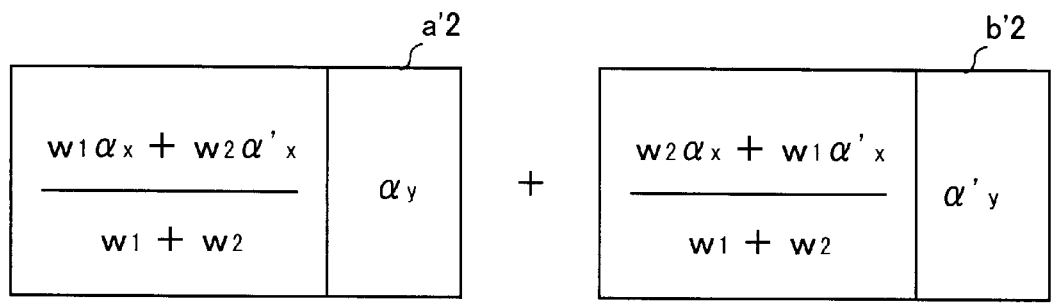

In this kind of crossover, as shown in FIG. 20, a pair of individuals are selected as parents, and weighted averages of gene values of their chromosome $a_2, b_2$ are calculated using given weighting factors to thereby determine new gene values, so that new chromosomes $a_2', b_2'$ are created for the children using the new gene values. According to the weighting crossover, it is possible to create a wide diversity of genes for children based on the genes of parents with simple calculatuions.

Put it in another way, genetic-algorithm executing step performs an exchanging crossover, and/or a weighting crossover based on a weighted average of gene values of the two individuals of the pair, as a genetic operation on at least one pair of individuals in the population.

Next, another of the genetic operations carried out on chromosomes, examples of mutation, include the following.

Mutation by Varying Parameters at Random

Figure 21:
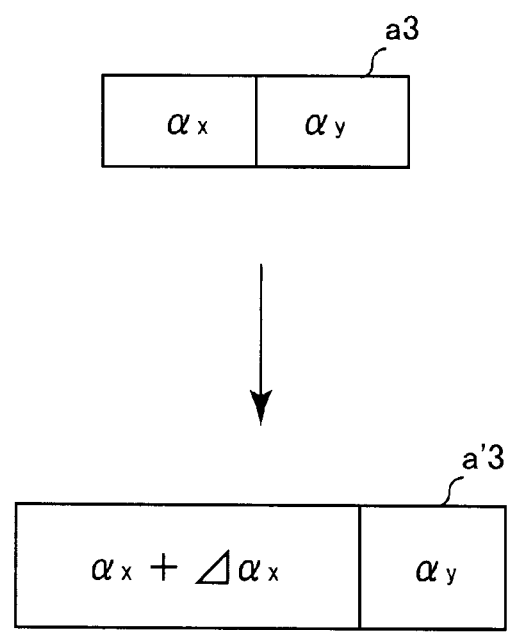
FIG. 21 is a diagram illustrating a mutation performed by varying gene values at random in the genetic algorithm of the embodiment.

In this kind of mutation, as shown in FIG. 21, gene values (parameters) of a chromosome $a_3$ are varied at random so that a mutated chromosome $a_3'$ is created. In order to avoid bad influence resulting from random variation, a range within which the gene values are varied is predetermined. According to this mutation, it is possible to increase the diversity of genes of individuals with simple operations.

Mutation by Decreasing Parameters

This kind of mutation is effective in a case where, as described later, the operations of executing the genetic algorithm, of generating a new third objective function and of executing the iterative-improvement algorithm are repeatedly carried out according to the schedule.

Figure 22:
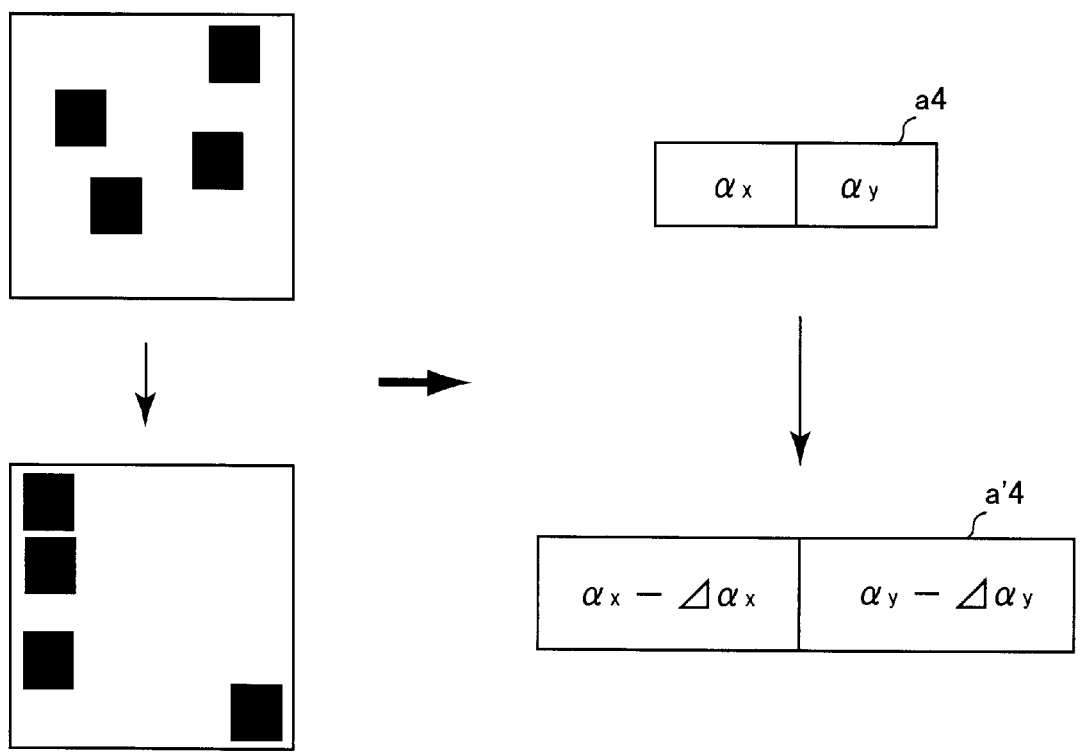
FIG. 22 is a diagram illustrating a mutation performed by decreasing gene values in the genetic algorithm of the embodiment.

As shown in FIG. 22, when the layout positions of the object elements were sifted too much in the last execution of the iterative-improvement algorithm and the resultant layout solution is rather away from satisfying the density-uniformalization condition or other layout conditions, gene values (parameters) of a chromosome $a_4$ are varied in such a manner that the last shifts of the object elements is decreased, so that a mutated chromosome $a_4'$ is created. Also in this case, in order to avoid bad influence resulting from excessive variation, a range within which the gene values are varied is predetermined. According to this mutation, it is possible to create a wide diversity of genes for children based on the genes of parents with simple calculatuions, with modifying the excessive shift of the layout solution by the iterative-improvement algorithm.

Mutation by Increasing Parameters

This kind of mutation is effective also in the case where the operations of executing the genetic algorithm, of generating a new third objective function and of executing the iterative-improvement algorithm are repeatedly carried out according to the schedule.

Figure 23:
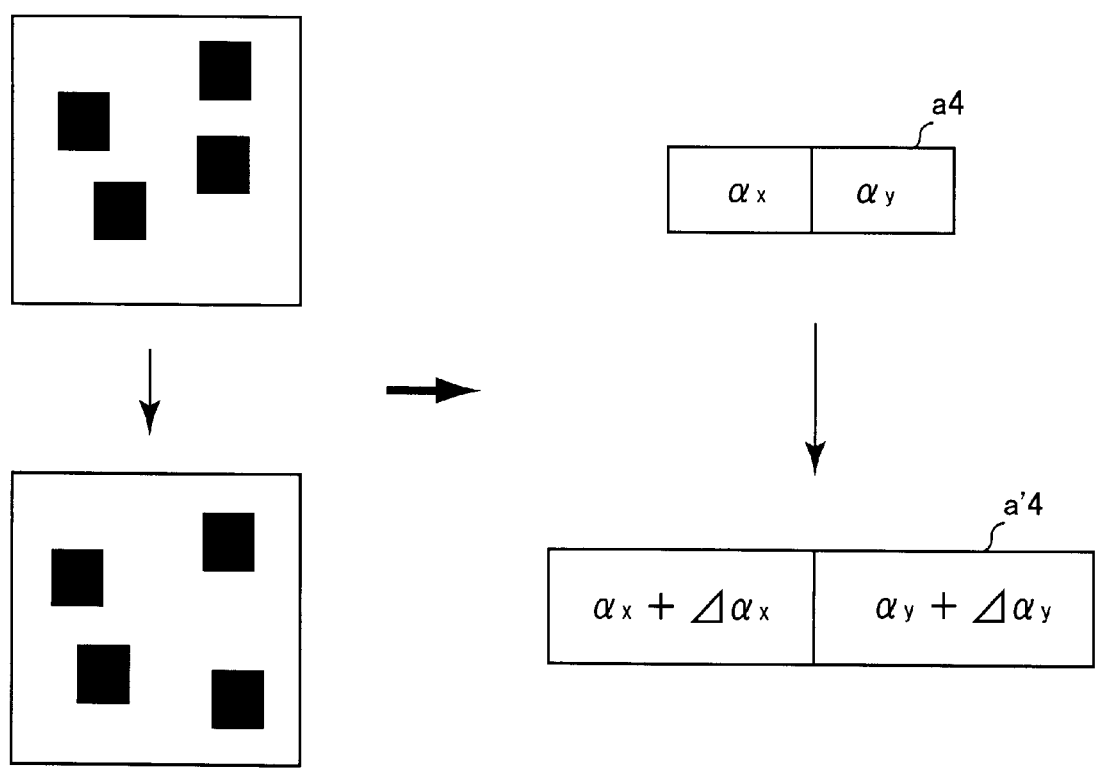
FIG. 23 is a diagram illustrating a mutation performed by increasing gene values in the genetic algorithm of the embodiment.

As shown in FIG. 23, when the layout positions of the object elements were sifted too little in the last execution of the iterative-improvement algorithm and the resultant layout solution is still far from satisfying the density-uniformalization condition or other layout conditions, gene values (parameters) of a chromosome $a_4$ are varied in such a manner that the last shifts of the object elements is increased, so that a mutated chromosome $a_4'$ is created. Also in this case, in order to avoid bad influence resulting from excessive variation, a range within which the gene values are varied is predetermined. According to this mutation, it is possible to create a wide diversity of genes for children based on the genes of parents with simple calculatuions, with modifying the excessive shift of the layout solution by the iterative-improvement algorithm.

Put it in another way, the genetic-algorithm executing step performs a mutation as a genetic operation on at least one individual in the population by varying a gene value of the one individual at random within a predetermined range or, when a resultant layout of the multiple object elements from a previous execution of the iterative-improvement algorithm does not meet a predetermined criterion, by varying a gene value of the one individual within such a range that the layout of the multiple object elements is improved. With this feature, it is possible to secure sufficient genetic diversity effectively.

Next, evaluation of fitness of each individual will be described in the following.

The evaluation of fitness is effective in a case, as described later, where the operations of executing the genetic algorithm, of generating a new third objective function and of executing the iterative-improvement algorithm are repeatedly carried out according to the schedule.

The genetic-algorithm executing section 44 first evaluates the fitness of each individual according to the type of chromosome of each individual, based on the result of the execution of an iterative-improvement algorithm. Then the genetic-algorithm executing section 44 selects fitting individuals based on the evaluation of the fitness, and carries out the following execution of the genetic algorithm using the selected individuals.

More specifically, the genetic-algorithm executing section 44 calculates the resultant value of the first objective function obtained by the execution of the iterative-improvement algorithm as the fitness for each individual.

Details of the calculation will be described in the following by the type of chromosome.

Type Chrom-1

For individuals having this type of chromosome, the fitness for the individual is calculated using the following procedure with the third objective function.

$$\text{Cost} + \alpha U \tag{11}$$

The iterative-improvement algorithm is carried out using the third objective function $\text{Cost} + \alpha U$ and, when the improved layout solution meets predetermined convergence condition (given criterion) or when a predetermined count of iteration is executed, the iterative-improvement algorithm is ended.

Assuming that the resultant value of the first objective function Cost from the current layout solution at that time is represented as $\text{Cost}_e$, the evaluation function of the fitness is defined as following.

$$(\text{fitness}) = \text{constraint} - \text{Cost}_e \tag{12}$$

Type Chrom-2

For individuals having this type of chromosome, the fitness for the individual is calculated using the following procedure with the third objective function.

$$(\text{Cost}_x + \alpha_x U_x) + (\text{Cost}_y + \alpha_y U_y) \tag{13}$$

The iterative-improvement algorithm is carried out using the third objective function $(\text{Cost}_x + \alpha_x U_x) + (\text{Cost}_y + \alpha_y U_y)$ and, when the improved layout solution meets predetermined convergence condition (given criterion) or when a predetermined count of iteration is executed, the iterative-improvement algorithm is ended.

Assuming that the resultant value of the first objective function $\text{Cost}_x + \text{Cost}_y$ from the current layout solution at that time is represented as $\text{Cost}_{xe} + \text{Cost}_{ye}$, the evaluation function of the fitness is defined as following.

$$(\text{fitness}) = \text{constraint} - (\text{Cost}_{xe} + \text{Cost}_{ye}) \tag{14}$$

Type Chrom-M

For individuals having this type of chromosome, the fitness for the individual is calculated using the following procedure with the third objective function.

$$\text{Cost} + \alpha(i, \beta_1, \beta_2, \ldots, \beta_n) \cdot U \tag{15}$$

The iterative-improvement algorithm is carried out using the third objective function $\text{Cost} + \alpha(i, \beta_1, \beta_2, \ldots, \beta_n) \cdot U$ and, when the improved layout solution meets predetermined convergence condition (given criterion) or when a predetermined count of iteration is executed, the iterative-improvement algorithm is ended.

Assuming that the resultant value of the first objective function Cost from the current layout solution at that time is represented as $\text{Cost}_e$, the evaluation function of the fitness is defined as following.

$$(\text{fitness}) = \text{constraint} - \text{Cost}_e \tag{16}$$

Type Chrom-2M

For individuals having this type of chromosome, the fitness for the individual is calculated using the following procedure with the third objective function.

$$(\text{Cost}_x + \alpha_x(i, \beta_{x1}, \beta_{x2}, \ldots, \beta_{xn}) \cdot U_x) + (\text{Cost}_y + \alpha_y(i, \beta_{y1}, \beta_{y2}, \ldots, \beta_{yn}) \cdot U_y) \tag{17}$$

The iterative-improvement algorithm is carried out using the third objective function $(\text{Cost}_x + \alpha_x(i, \beta_{x1}, \beta_{x2}, \ldots, \beta_{yn}) \cdot U_x) + (\text{Cost}_y + \alpha_y(i, \beta_{y1}, \beta_{y2}, \ldots, \beta_{yn}) \cdot U_y)$ and, when the improved layout solution meets predetermined convergence condition (given criterion) or when a predetermined count of iteration is executed, the iterative-improvement algorithm is ended.

Assuming that the resultant value of the first objective function $\text{Cost}_x + \text{Cost}_y$ from the current layout solution at that time is represented as $\text{Cost}_{xe} + \text{Cost}_{ye}$, the evaluation function of the fitness is defined as following.

$$(\text{fitness}) = \text{constraint} - (\text{Cost}_{xe} + \text{Cost}_{ye}) \tag{18}$$

Type Chrom-S

For individuals having this type of chromosome, the iterative-improvement algorithm is carried out using the third objective function $\text{Cost} + \alpha U$ or $(\text{Cost}_x + \alpha_x U_x) + (\text{Cost}_y + \alpha_y U_y)$, according to a schedule defined by the chromosome for packing of the slots. When the improved layout solution meets predetermined convergence condition (given criterion) or when a predetermined count of iteration is executed, the iterative-improvement algorithm is ended.

Assuming that the resultant value of the first objective function Cost or $\text{Cost}_x + \text{Cost}_y$ from the current layout solution at that time is represented as $\text{Cost}_e$ or $\text{Cost}_{xe} + \text{Cost}_{ye}$, the evaluation function of the fitness is defined as following.

$$(\text{fitness}) = \text{constraint} - \text{Cost}_e \tag{19}$$

or $$(\text{fitness}) = \text{constraint} - (\text{Cost}_{xe} + \text{Cost}_{ye}) \tag{20}$$

Type Chrom-I

For individuals having this type of chromosome, the third objective function is generated based on gene values of the chromosome relating to a schedule.

The iterative-improvement algorithm is carried out using the third objective function $\text{Cost} + \alpha U$ or $(\text{Cost}_x + \alpha_x U_x) + (\text{Cost}_y + \alpha_y U_y)$ and, when the improved layout solution meets predetermined convergence condition (given criterion) or when a predetermined count of iteration is executed, the iterative-improvement algorithm is ended.

Assuming that the resultant value of the first objective function Cost or $Cost_x+Cost_y$ from the current layout solution at that time is represented as $Cost_e$ or $Cost_{xe}+Cost_{ye}$, the evaluation function of the fitness is defined as following.

$$\text{(fitness)}=\text{constraint}-Cost_e \quad (11)$$

or $$\text{(fitness)}=\text{constraint}-(Cost_{xe}+Cost_{ye}) \quad (12)$$

According to the above-described evaluation functions of the fitness, the larger the fitness value calculated for the chromosome, the more desirable layout solution is obtained to the layout conditions of the layout problem (the remaining conditions of the uniform-density layout problem other than the density-uniformalization condition) by executing the iterative-improvement algorithm using the third objective function determined based on genes of the chromosome. Consequently, using genes of a chromosome that has the larger fitness value, it is possible to obtain a third objective function that would reach the more desirable layout solution.

Thus, the genetic-algorithm executing section 44 selects individuals whose chromosomes having large fitness values under predetermined criteria using the evaluation functions of the fitness, and carries out the following execution of the genetic algorithm using the selected individuals. It is preferable, as the case may be, to perform reproduction of the selected individuals at that time so as to adjust the number of individuals.

Put it in another way, the genetic-algorithm executing step evaluates a fitness of each of individuals of a current population based on a result of a previous execution of the iterative-improvement algorithm, selects a number of individuals from the individuals of the current population based on the evaluated fitness of each of the individuals to thereby generate a new population, and executes the genetic algorithm on the generated new generation. With this feature, it is possible to fully evaluate the fitness of each individual and to efficiently select desirable individuals, so that the speed of and the efficiency in determining the optimal solution are further improved.

In addition to the above-described operations common for the genetic algorithm, by generating plural subpopulations as described in the following and by executing the genetic algorithm based on the generated subpopulations, it is possible to search effectively for the optimal solution with maintaining high diversity of the chromosomes. Such model is referred to as "Island" model in the following.

In the "Island" model, the genetic-algorithm executing section 44 first divides individuals according to the type of chromosome of each individual, thereby generating plural subpopulations named Islands.

Then, the genetic-algorithm executing section 44 executes the genetic algorithm on individuals in the plural Islands, with generally isolating individuals of each Island from individuals of each other Island and occasionally making the individuals of each Island interact with the individuals of each other Island according to the schedule.

Figure 24:
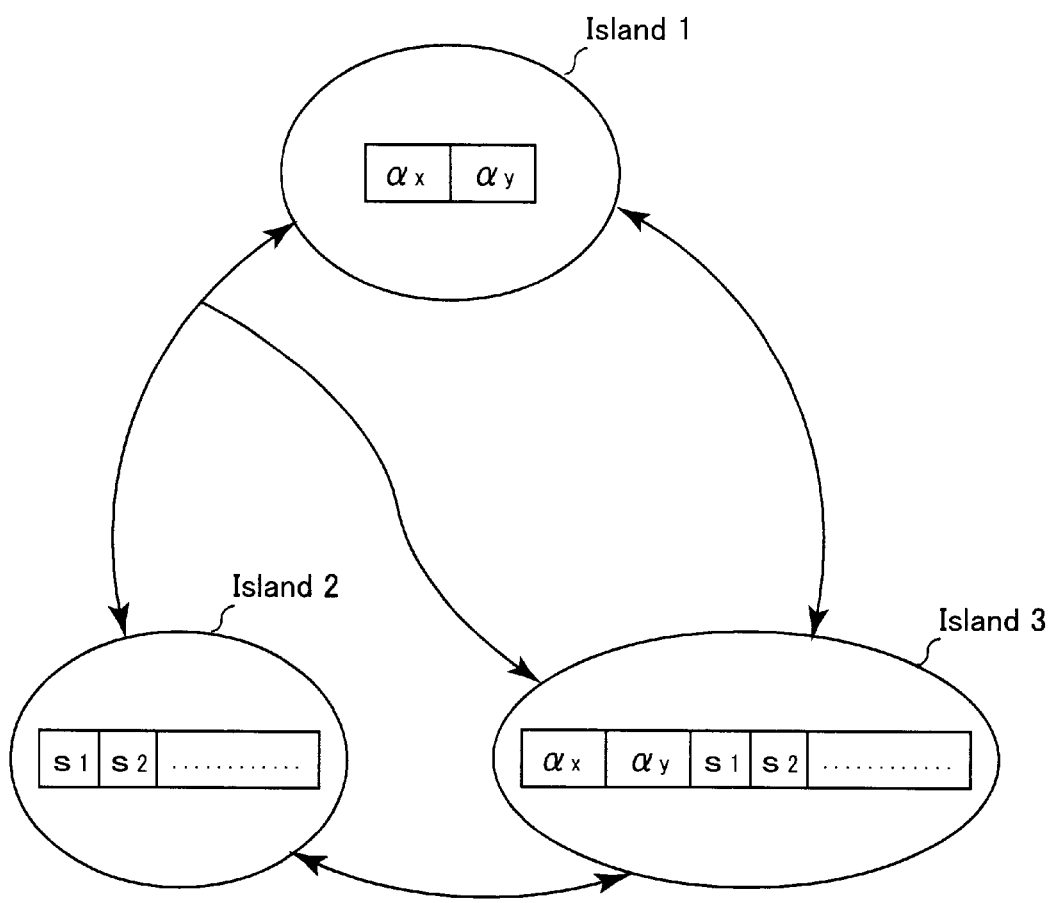
FIG. 24 is a diagram illustrating "Island" model in the genetic algorithm of the embodiment.

As a specific example, it is preferable that, as shown in FIG. 24, the genetic-algorithm executing section 44 generates the following three Islands.

Island 1

This Island is composed of individuals each having a chromosome whose genes represent parameters of the third objective function. The chromosome type of each individual included in this Island is Chrom-1, Chrom-2, Chrom-M or Chrom-2M (in FIG. 24, chromosomes of type Chrom-2 are shown as examples).

Island 2

This Island is composed of individuals each having a chromosome whose genes represent parameters of the schedule for executing the individual operations of the present method. The chromosome type of each individual included in this Island is Chrom-S.

Island 3

This Island is composed of individuals each having a combination of a chromosome whose genes represent parameters of the third objective function and a chromosome whose genes represent parameters of the schedule for executing the individual operations of the present method. The chromosome type of each individual included in this Island is Chrom-I (in FIG. 24, chromosomes of Chrom-I generated by combining Chrom-2 and Chrom-S are shown as examples).

Put it in another way, the genetic-algorithm executing step divides the individuals of the current population into 1) a first subpopulation (Island 1) of individuals, each of which has genes representing parameters of the third objective function generated in the objective-function generating step, 2) a second subpopulation (Island 2) of individuals, each of which has genes representing parameters of the predetermined schedule, and 3) a third subpopulation (Island 3) of individuals, each of which has both genes representing parameters of the third objective function generated in the objective-function generating step and genes representing parameters of the predetermined schedule. With this feature, it is possible to efficiently group the individuals into orderly subpopulations according to the type of the chromosome of each individual, and also possible to administer the subpopulations without difficulty.

After the plural Islands are generated, the genetic-algorithm executing section 44 executes the genetic algorithm on individuals in the plural Islands, with generally isolating individuals of each Island from individuals of each other Island and occasionally making the individuals of each Island interact with the individuals of each other Island.

After a predetermined number of generations has elapsed, a pair of individuals are selected each from Island 1 and Island 2 as parents using an appropriate procedure, and the chromosomes of the parents are combined to thereby generate the chromosome for a child. The generated child is migrated to Island 3.

In the meantime, a pair of individuals are selected each from Island 1 and Island 3 as parents using an appropriate procedure, and the crossover is performed on the chromosomes of the parents to thereby generate the chromosomes for a pair of children. At this time, in the chromosome of the individual from Island 3, the crossover with the chromosome of the individual from Island 1 is performed in a region that has genes representing parameters of the third objective function. One of the generated pair of children has a chromosome which includes only genes representing parameters of the third objective function, while another has a chromosome which includes both of genes representing parameters of the third objective function and genes representing parameters of the predetermined schedule. The former child and the latter one are emigrated to Island 1 and Island 3, respectively.

Likewise, a pair of individuals are selected each from Island 2 and Island 3 as parents using an appropriate procedure, and the crossover is performed on the chromosomes of the parents to thereby generate the chromosomes for a pair of children. At this time, in the chromosome of the individual from Island 3, the crossover with the chromosome of the individual from Island 2 is performed in a region that has genes representing parameters of the predetermined schedule. One of the generated pair of children has a chromosome which includes only genes representing parameters of the predetermined schedule, while another has a chromosome which includes both of genes representing parameters of the third objective function and genes representing parameters of the predetermined schedule. The former child and the latter one are emigrated to Island 2 and Island 3, respectively.

Put it in another way, the genetic-algorithm executing step has 1) a feature of: selecting one individual from the first subpopulation (Island 1) and another individual from the second subpopulation (Island 2) as parents; performing a crossover operation on a pair of chromosomes of the parents to thereby generate a pair of chromosomes for children; and migrating a pair of children, each of which has a respective one of the generated chromosome pair, into the third subpopulation (Island 3), and 2) a feature of: selecting one individual from the first or second subpopulation (Island 1 or 2) and another individual from the third subpopulation (Island 3) as parents; performing a crossover operation on a pair of chromosomes of the parents to thereby generate a pair of chromosomes for children; and migrating a pair of children, each of which has a respective one of the generated chromosome pair, into the first or second subpopulation (Island 1 or 2) and the third subpopulation (Island 3) respectively. With these features, it is possible to increase genetic diversity of the individuals effectively by making the individuals of different subpopulations (Island) interact with each other with simple operations, so that the efficiency in executing the genetic algorithm is improved.

To sum up, the genetic-algorithm executing step has a feature of: dividing individuals of a current population into a plurality of subpopulations (Islands) in accordance with a kind of genes included in a chromosome of each of the individuals of the current population; executing the genetic algorithm on each of the plural subpopulations (Islands) separately; and during the executing of the genetic algorithm, exchanging a number of individuals between the plural subpopulations (Islands) in accordance with the predetermined schedule. With this feature, since the appropriate parameters are determined effectively based on a great diversity of chromosomes, it is possible to generate an appropriate objective function (third objective function) representing the uniform-density layout problem with high speed, so that the speed of and the efficiency in determining the optimal solution is further improved.

(2-6) Operation in Schedule Management Section (Part 2).

Prior to the initial execution of the genetic algorithm by the genetic-algorithm executing section 44, the schedule management section 45 prepares, in addition to the above-described schedule, another schedule defining a series of operations of executing the genetic algorithm by the genetic-algorithm executing section 44, of generating the third objective function by the objective-function generating section 42 and of executing the iterative-improvement algorithm by the iterative-improvement-algorithm executing section 43.

And the schedule management section 45 controls the objective-function generating section 42, the iterative-improvement-algorithm executing section 43 and the genetic-algorithm executing section 44 so that the execution of the genetic algorithm, the generation of the third objective function and the execution of the iterative-improvement algorithm are repeatedly carried out according to the prepared schedule.

In other words, conditions for shifting the flow to NO2 route of S5 in FIG. 3 are established by the shift of the operation flow.

In the following, operation of the schedule management section 45 will be described in details.

The schedule management section 45 prepares, prior to the initial execution of the genetic algorithm by the genetic-algorithm executing section 44, a schedule defining a series of operations of executing the genetic algorithm by the genetic-algorithm executing section 44, of generating the third objective function by the objective-function generating section 42 and of executing the iterative-improvement algorithm by the iterative-improvement-algorithm executing section 43.

It is preferable that the schedule is inputted to the present apparatus as data together with the various data relating to the uniform-density layout problem, or automatically generated in the schedule management section 45 based on the various data on the uniform-density layout problem inputted to the present apparatus. The advantageous results from the former and latter features are as described previously.

The details of the schedule are represented as criteria for deciding timings on which, and conditions under which, the operation flow shifts to the execution of the genetic algorithm by the genetic-algorithm executing section 44 during the execution of the iterative-improvement algorithm by the iterative-improvement-algorithm executing section 43. For example, it is represented as criteria such that a iteration count of the iterative-improvement algorithm reaches a predetermined constraint, the fitness value for each individual is evaluated with the current layout solution at that time so as to select fitted individuals, and the operation flow then shifts to the execution of the genetic algorithm by the genetic-algorithm executing section 44, and the like.

The, according to the prepared schedule, the schedule management section 45 controls the objective-function generating section 42 to stop the iterative-improvement algorithm when a iteration count of the iterative-improvement algorithm by the iterative-improvement-algorithm executing section 43 reaches a predetermined value, and also controls the genetic-algorithm executing section 44 to calculate the fitness value for each individual obtained by the last execution of the genetic algorithm using the forementioned procedures, based on both the current layout solution at that time and the third objective function defined by genes of the current individuals at that time.

Next, the schedule management section 45 controls the genetic-algorithm executing section 44 to select fitted individuals based on the calculated fitness value for each individual, and to execute the genetic algorithm using the selected individuals.

Further, subsequently to the execution of the genetic algorithm by the genetic-algorithm executing section 44, the schedule management section 45 controls the objective-function generating section 42 and the iterative-improvement-algorithm executing section 43 so that the generation of a new objective function and the execution of the iterative-improvement algorithm are carried out again.

Thus, after the execution of the genetic algorithm by the genetic-algorithm executing section 44, generation of a new objective function by the objective-function generating section 42, and the execution of the iterative-improvement algorithm by the iterative-improvement-algorithm executing section 43 is repeated, it is discriminated whether a iteration count of the iterative-improvement algorithm executed by the iterative-improvement-algorithm executing section 43 meets a given criterion, and also whether the obtained layout solution, which is a candidate for an optimal solution, meets a given criterion.

When the iterative-improvement-algorithm executing section 43 or the schedule management section 45 has judged that either of the generation of the objective function and the iteration count of the iterative-improvement algorithm satisfies the corresponding criterion, the current layout solution being a candidate for the optimal solution is determined as the approximately optimal solution.

(3) Others

According to the scale of the uniform-density layout problem being an object of the present invention, it is possible to obtain the like advantageous result with simpler configuration than that of the above-described embodiment.

(3-1) First Modification of the Embodiment

As a modification of the embodiment is possible to omit the schedule management section 45 from the configuration and to configure the optimal-solution determining apparatus according to the present invention with the initial-layout obtaining section 41, the objective-function generating section 42, the iterative-improvement-algorithm executing section 43 and the genetic-algorithm executing section 44.

According to the modification, the initial-layout obtaining section 41, the objective-function generating section 42, the iterative-improvement-algorithm executing section 43 and the genetic-algorithm executing section 44 are configured similarly to the corresponding components of the above embodiment.

And the individual components carry out the corresponding operations in the above embodiment, namely: the initial-layout obtaining step (S1); the genetic-algorithm executing step (S2; objective-function generating step (S3); and the iterative-improvement-algorithm executing step (S4) each only once. In the last step (S4), the execution of the iterative-improvement algorithm is continued until the layout solution satisfying with given criteria is obtained.

Also with this configuration, it is possible to obtain the advantageous results of the present invention. Namely, with this relatively simple configuration, it is possible to determine efficiently the optimal solution with high speed, without the need of any special procedure for reducing non-uniformity in density of the multiple object elements.

(3-2) Second Modification of the Embodiment

When the number of object elements is relatively small and the layout conditions are relatively simple in the object uniform-density layout problem, it is possible to omit the genetic-algorithm executing section 44 from the configuration and to configure the apparatus according to the present invention with the initial-layout obtaining section 41, the objective-function generating section 42, the iterative-improvement-algorithm executing section 43 and the schedule management section 45.

According to the second modification, the initial-layout obtaining section 41, the objective-function generating section 42 and the iterative-improvement-algorithm executing section 43 are configured similarly to the corresponding components of the above embodiment, whereas the schedule management section 45 is configured so as not to have either of the function of preparing a schedule for executing the genetic algorithm by the genetic-algorithm executing section 44 and the function of controlling the genetic-algorithm executing section 44 according to the schedule.

Figure 25:
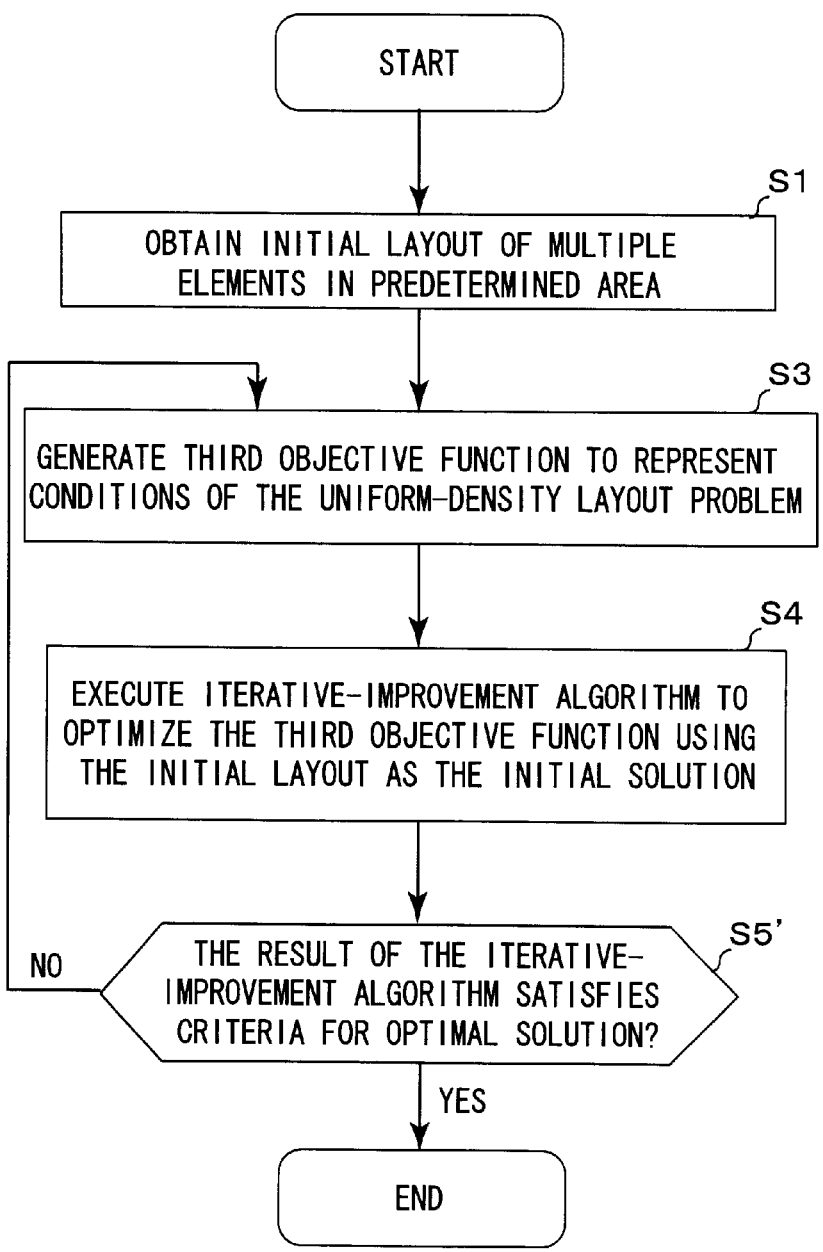
FIG. 25 is a flowchart showing a succession of procedural steps for determining an optimal solution to a uniform-density layout problem in an optimal-solution determining apparatus according to a modification of the embodiment (an optimal-solution determining method according to the modification)

And, as shown in FIG. 25, after the initial layout is obtained by the initial-layout obtaining section 41 (S1), the operation flow shifts to the generation of an objective function by the objective-function generating section 42 (S3). Then, the iterative-improvement algorithm is executed by the iterative-improvement-algorithm executing section 43 (S4), and it is discriminated whether the resultant layout solution meets given criteria (S5'). If the layout solution is judged not to meets the given criteria (NO route of S5'), the operation flow shifts again to the generation of a new objective function by the objective-function generating section 42 (S3), while If the layout solution is judged to meets the given criteria (YES route of S5'), the layout solution is determined as an approximately optimal solution to the uniform-density layout problem.

With this configuration, it is possible to obtain the advantageous results of the present invention. Namely, with this relatively simple configuration, since a optimal solution to a given uniform-density layout problem can be searched for by iteratively improving an initial solution through the optimization of a simple objective function being of relatively low order (third objective function), it is possible to determine efficiently the optimal solution with high speed, without the need of any special procedure for reducing non-uniformity in density of the multiple object elements.

It is also possible to omit the schedule management section 45 from the configuration and to configure the optimal-solution determining apparatus according to the present invention with the initial-layout obtaining section 41, the objective-function generating section 42 and the iterative-improvement-algorithm executing section 43.

According to the third modification, the initial-layout obtaining section 41, the objective-function generating section 42 and the iterative-improvement-algorithm executing section 43 are configured similarly to the corresponding components of the above embodiment.

The individual components carry out the corresponding operations in the above embodiment, namely: the initial-layout obtaining step (S1), the objective-function generating step (S3) and the iterative-improvement-algorithm executing step (S4) each for once. In the last step (S4), the execution of the iterative-improvement algorithm is continued until the layout solution satisfying with given criteria is obtained.

With this configuration, it is possible to obtain the advantageous results of the present invention. Namely, with this relatively simple configuration, it is possible to determine efficiently the optimal solution with high speed, without the need of any special procedure for reducing non-uniformity in density of the multiple object elements.

(3—3) Third Modification of the Embodiment

When the number of object elements is relatively small and the layout conditions are relatively simple in the object uniform-density layout problem, it is possible to omit the initial-layout obtaining section 41, the iterative-improvement-algorithm executing section 43, the genetic-algorithm executing section 44 and the schedule management section 45 from the configuration and to configure the apparatus according to the present invention with the objective-function generating section 42 and an optimal-solution calculating section.

As described above, in a common uniform-density layout problem, the object elements are numerous and the layout conditions are much complicated, it is impossible, or almost impossible, to calculate the strictly optimal solution that optimizes the corresponding objective function (the third objective function). But, in special cases where the number of object elements is relatively small and the layout conditions are relatively simple, since the third objective function also is relatively simple, it is possible to calculate the strictly optimal solution that optimizes the corresponding objective function (the third objective function), so that the present configuration may be effective.

According to the third modification, the objective-function generating section 42 is configured similarly to the corresponding component of the above embodiment.

The optimal-solution calculating section is operable to optimize the third objective function generated by the objective-function generating section 42, thereby searching for the optimal solution to the uniform-density layout problem. Specifically, the optimal-solution calculating section is operable to directly calculate the layout solution that optimizes the third objective function generated by the objective-function generating section 42 (namely, the strictly optimal solution).

Figure 26:
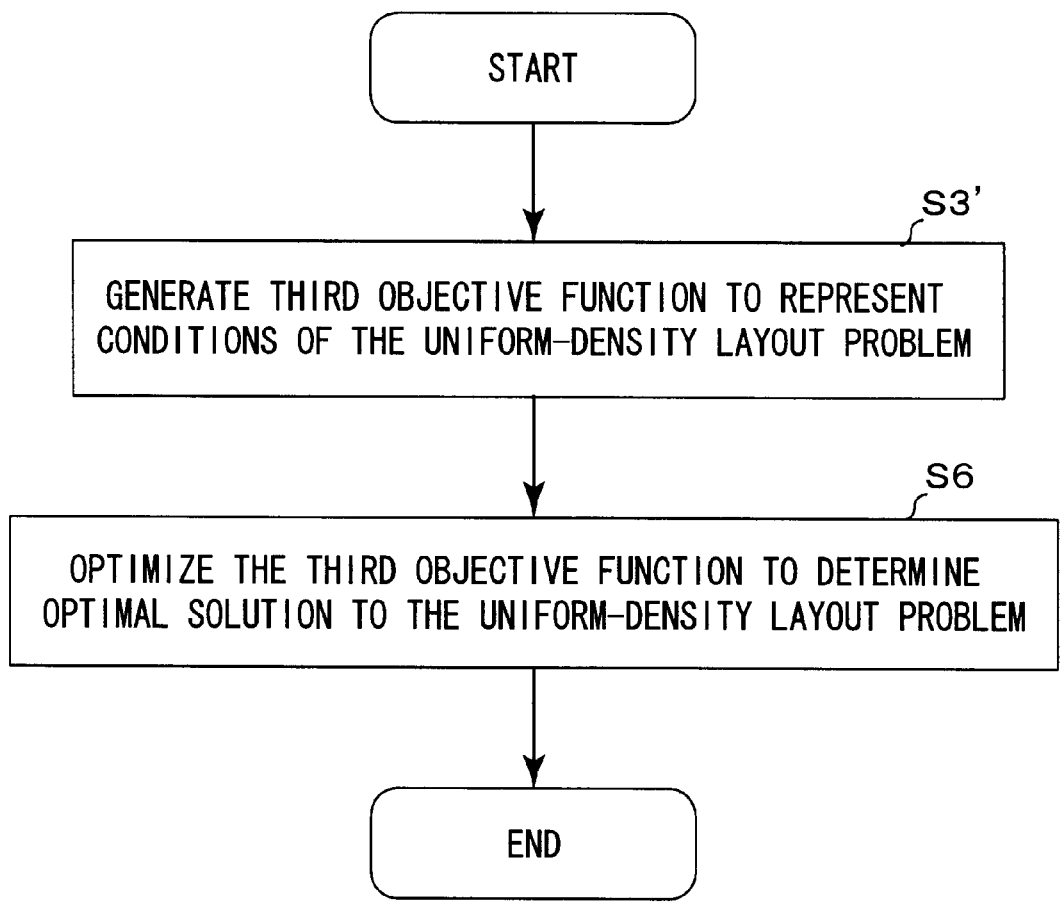
FIG. 26 is a flowchart showing a succession of procedural steps for determining an optimal solution to a uniform-density layout problem in an optimal-solution determining apparatus according to a second embodiment of the present invention (an optimal-solution determining method according to the second embodiment)

With the above-described configuration, as shown in FIG. 26, in the objective-function generating step (S3), the third objective function is generated for the object uniform-density layout problem by the objective-function generating section 42. And then, the optimal-solution calculating section directly calculates the layout solution that optimizes the generated third objective function (the optimal solution to the third objective function) and determines it as the optimal solution to the uniform-density layout problem (S6).

With this configuration, it is possible to obtain the advantageous results of the present invention. Namely, with this quite simple configuration, it is possible to determine efficiently the optimal solution with high speed, without the need of any special procedure for reducing non-uniformity in density of the multiple object elements.

(3-4) Others

The present invention is not limited to the embodiment described hereinabove, and can be carried out in various forms without departing from the spirit thereof.

WORKING EXAMPLE

In the following example, the present invention is applied to a layout problem of multiple cells (circuit elements) in the LSI-circuits designing.

In the LSI-circuits designing, it is required to arrange multiple cells on a substrate based on interconnection relationship between the cells so that a total wiring length between the cells is minimum. In addition, since each cell has a specific size and shape, a requirement arises that the cells must be arranged on the substrate in substantially uniform density so as not to overlap with each other. Assuming the cells as object elements, the requirement is equivalent to the uniform-density layout problem, with which the present invention is intended to deal.

If the conventional technology is used, general procedural steps for solve such a problem are: generating an objective function which represents the total wiring length between the cells; determining the optimal solution (to be precise, an approximately optimal solution) to the objective function using an iterative-improvement algorithm; and reducing the non-uniformity of the density of cells in the determined layout solution using an iterative-improvement algorithm or a genetic algorithm. Such procedural steps, even though not impossible, need an enormous amount of arithmetic processing, so that it will take much time to carry out the steps. In a common problem practical in scale, since the cells are numerous and their interconnection relationship is much complicated, it is difficult to effectively solve the problem using the conventional technologies.

On the contrast, it is expected that, by applying the present invention to such a problem, since a optimal solution to a given uniform-density layout problem can be searched for by iteratively improving an initial solution through the optimization of a simple objective function being of relatively low order (third objective function), it is possible to determine efficiently the optimal solution with high speed, without the need of any special procedure for reducing non-uniformity in density of the multiple object elements.

Thus such a problem is subjected to the present invention in the following working example.

The method according to the second modification to the embodiment of the present invention (namely, obtainment of the initial layout, generation of an objective function, execution of an iterative-improvement algorithm, and management of a schedule) is applied to an actual data in which the number of cells is 10000.

The initial layout of the cells (object elements) is determined by arranging the cells at random within the layout region. The first objective function is generated by calculating a Euclidean distance for every pair of cells that are in interconnection relationship, squaring the calculated Euclidean distance, and totalizing the squared Euclidean distances for all of the cell pairs. The second objective function is generated using a procedure for virtually arranging the cells (namely, the packing procedure). As an iterative-improvement algorithm, a conjugate gradient method (a kind of non-linear programming) is used. The linear combination coefficient $\alpha$ of the first objective function and the second objective function is defined by setting the initial value $\alpha_0$ as 0.1 and the increment for every 5 iteration count as 0.05.

Figure 27:
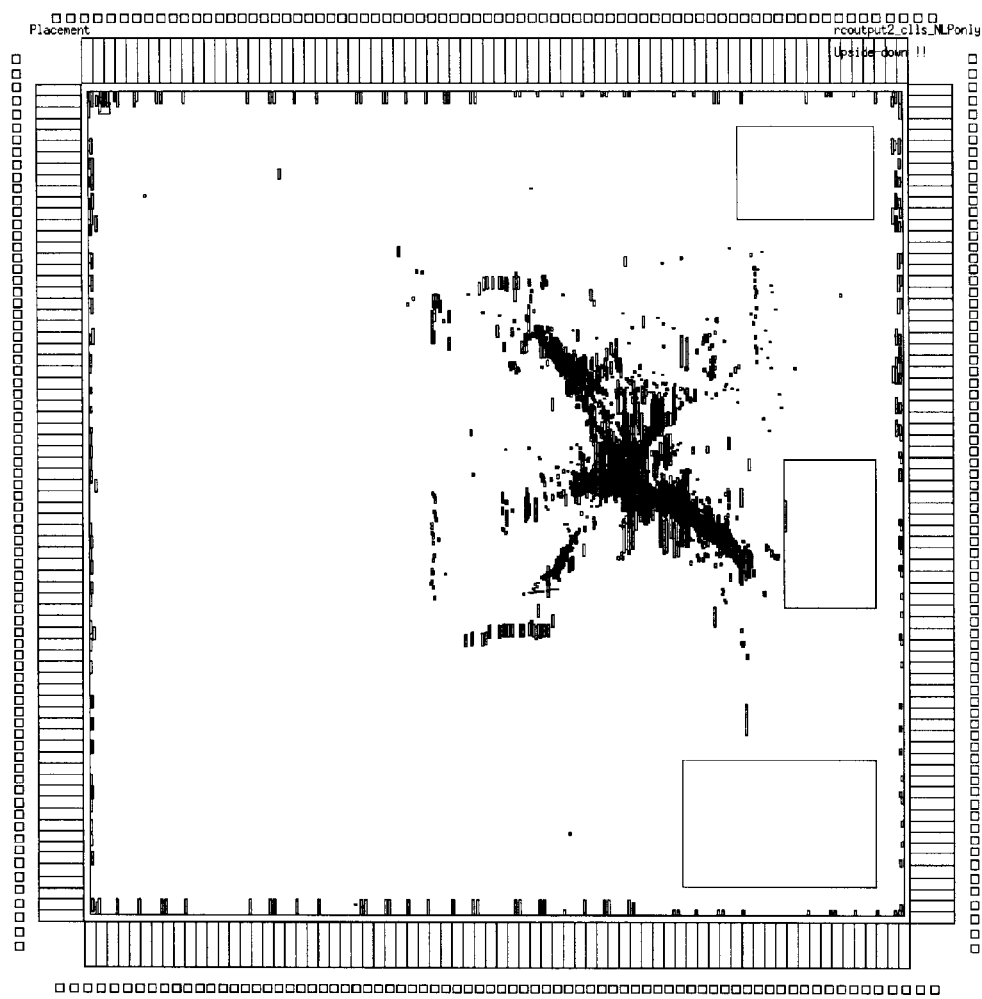
FIG. 27 is a diagram illustrating an initial layout state of multiple cells (object elements) in a working example of the present invention.
Figure 28:
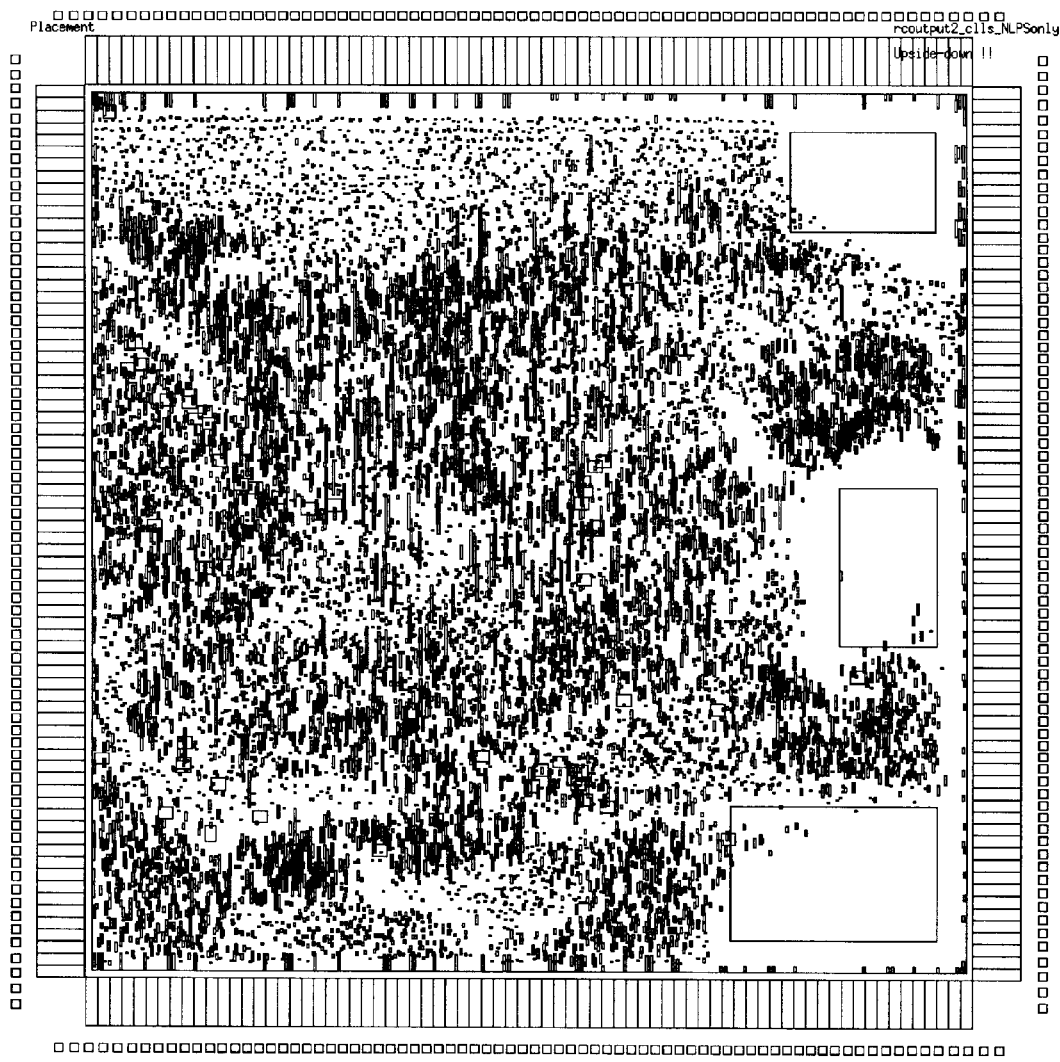
FIG. 28 is a diagram illustrating a resultant layout state of the multiple cells in the working example.

FIG. 27 shows the initial layout of the cells (object elements), and FIG. 28 shows the resultant layout (layout solution) after the iterative-improvement algorithm has been executed for 790 iteration count. It is quite obvious that the considerable non-uniformity of the cell density in the initial layout has been reduced by executing the method of the present invention and that the cells are distributed in substantially uniform density in the resultant layout.

As a measure for evaluating the non-uniformity of the cell density, a total area of the overlaps between the cells is calculated for each layout. The square of grid is used as a unit of the total area, where the grid (1 grid=2,500 nm) is commonly used as a unit of length for arranging cells.

In the initial layout, the total area of overlaps between any of the cells is $464 \times 10^6$ $grid^2$, whereas in the resultant layout after execution of the method of the present invention (after execution of the iterative-improvement algorithm for 790 iteration count), the total area of overlaps between any of the cells is $1 \times 10^6$ $grid^2$. By executing the method of the present invention non-uniformity of the cell density has been reduced to $1/464$.

What is claimed is:

1. A computer-implemented method of determining a first optimal solution to a first layout problem requiring an optimal layout of a multiplicity of elements in a predetermined region under a first set of conditions, which includes a uniformalization condition such that the multiple elements are distributed in substantially uniform density throughout the predetermined region, as the first optimal solution, comprising the steps of:

(A) analyzing said first layout problem into the uniformalization condition and a second layout problem requiring an optimal layout of the multiple elements in the same predetermined region under a second set of conditions, which comprises the remaining conditions of the first set of conditions other than the uniformalization condition, as a second optimal solution and generating a linear combination of a first objective function, which represents the second set of conditions of said second layout problem, and a second objective function, which represents the uniformalization condition of said first layout problem, as a third objective function, which is assumed to represent the first set of conditions of said first layout problem; and (B) optimizing said third objective function generated in said step (A), whereby the first optimal solution to the first layout problem is determined.

2. A method according to claim 1, wherein in said step (B), a function relating to density of the multiple elements is generated as said second objective function.

3. A method according to claim 1, wherein in said step (B), a function relating to area density of the multiple elements is generated as said second objective function.

4. A method according to claim 1, wherein in said step (B), a function relating to the number of overlaps between any two or more of the multiple elements is generated as said second objective function.

5. A method according to claim 1, wherein in said step (B), a function relating to the total area of overlaps between any two or more of the multiple elements is generated as said second objective function.

6. A computer-implemented method of determining a first optimal solution to a first layout problem requiring an optimal layout of a multiplicity of elements in a predetermined region under a first set of conditions, which includes a uniformalization condition such that the multiple elements are distributed in substantially uniform density throughout the predetermined region, as the first optimal solution, comprising the steps of:

(a) obtaining an initial layout of the multiple elements in the predetermined region;

(b) analyzing said first layout problem into the uniformalization condition and a second layout problem requiring an optimal layout of the multiple elements in the same predetermined region under a second set of conditions, which comprises the remaining conditions of the first set of conditions other than the uniformalization condition, as a second optimal solution and generating a linear combination of a first objective function, which represents the second set of conditions of said second layout problem, and a second objective function, which represents the uniformalization condition of said first layout problem, as a third objective function, which is assumed to represent the first set of conditions of said first layout problem; and (c) optimizing the third objective function generated in said step (b) by executing an iterative-improvement algorithm on said third objective function using said initial layout obtained in said step (a) as an initial solution, whereby the first optimal solution to the first layout problem is determined.

7. A method according to claim 6, wherein:

said method further comprises the step of (d) representing at least one of a group of one or more first parameters, which relate to said generating of said third objective function in said step (b), and a group of one or more second parameters, which relate to said executing of said iterative-improvement algorithm in said step (c), as genes and executing a genetic algorithm on an initial population of individuals each of which has at least one chromosome being a string of the genes; and at least one of said generating of said third objective function in said step (b) and said executing of said iterative-improvement algorithm in said step (c) is carried out based on parameters represented by genes included in chromosomes of the individuals in the resultant population from said executing of said genetic algorithm in said step (d).

8. A method according to claim 7, wherein said generating of said third objective function in said step (b), said executing of said iterative-improvement algorithm in said step (c) and said executing of said genetic algorithm in said step (d) are repeatedly carried out according to a predetermined schedule.

9. A method according to claim 8, wherein in said step (d), parameters of said predetermined schedule are represented by genes, and the chromosome of each individual is generated using said genes.

10. A method according to claim 8, wherein in said step (d), at least either of 1) one or more coefficients of said third objective function generated in said step (b) and 2) parameters of said predetermined schedule are represented by genes, and the chromosome of each individual is generated using said genes.

11. A method according to claim 8, wherein said step (d) includes performing a mutation as a genetic operation on at least one individual in the population, when a resultant layout of the multiple elements from a previous execution of said iterative-improvement algorithm in said step (c) does not meet a predetermined criterion, by varying a gene value of the one individual within such a range that the layout of the multiple elements is improved.

12. A method according to claim 8, wherein said step (d) includes:

evaluating a fitness of each of individuals of a current population based on a result of a previous execution of said iterative-improvement algorithm in said step (c);

selecting a number of individuals from the individuals of the current population based on the evaluated fitness of each said individual to thereby generate a new population; and executing said genetic algorithm on the generated new generation.

13. A method according to claim 12, wherein said evaluating in said step (d) calculates a fitness value for each said individual using said first objective function and evaluates the fitness of each said individual based on the calculated fitness value.

14. A method according to claim 8, wherein said step (d) includes:

dividing individuals of a current population into a plurality of subpopulations in accordance with a kind of genes included in a chromosome of each of the individuals of the current population;

executing said genetic algorithm on each of the plural subpopulations separately; and during said executing said genetic algorithm, exchanging a number of individuals between the plural subpopulations in accordance with said predetermined schedule.

15. A method according to claim 14, wherein in said step (d), the individuals of the current population is divided into 1) a first subpopulation of individuals, each of which has genes representing parameters of said third objective function generated in said step (b), 2) a second subpopulation of individuals, each of which has genes representing parameters of said predetermined schedule, and 3) a third subpopulation of individuals, each of which has both genes representing parameters of said third objective function generated in said step (b) and genes representing parameters of said predetermined schedule.

16. A method according to claim 15, wherein said step (d) includes:
   selecting one individual from the first subpopulation and another individual from the second subpopulation as parents;
   performing a crossover operation on a pair of chromosomes of the parents to thereby generate a pair of chromosomes for children; and
   migrating a pair of children, each of which has a respective one of the generated chromosome pair, into the third subpopulation.

17. A method according to claim 15, wherein said step (d) includes:
   selecting one individual from the first or second subpopulation and another individual from the third subpopulation as parents;
   performing a crossover operation on a pair of chromosomes of the parents to thereby generate a pair of chromosomes for children; and
   migrating a pair of children, each of which has a respective one of the generated chromosome pair, into the first or second subpopulation and the third subpopulation respectively.

18. A method according to claim 7, wherein in said step (d), one or more coefficients of said third objective function generated in said step (b) are represented by genes, and said chromosome of each individual is generated using said genes.

19. A method according to claim 18, wherein in said step (d), assuming that said third objective function generated in said step (b) is expressed as Cost+$\alpha$U where Cost is said first objective function and U is said second objective function, the coefficient $\alpha$ is represented by said genes.

20. A method according to claim 18, wherein in said step (d), assuming that said third objective function generated in said step (b) is expressed as (Cost$_x$+$\alpha_x$U$_x$)+(Cost$_y$+$\alpha_y$U$_y$) where Cost$_x$ is an x-coordinate component of said first objective function, Cost$_y$ is a y-coordinate component of said first objective function, U$_x$ is an x-coordinate component of said second objective function, and U$_y$ is a y-coordinate component of said second objective function, the coefficient $\alpha_x$ and the coefficient $\alpha_y$ are represented by said genes.

21. A method according to claim 18, wherein in said step (d), assuming that said third objective function generated in said step (b) is expressed as Cost+$\alpha$U where Cost is said first objective function and U is said second objective function, and that $\alpha$ is a function of a current iteration count of said iterative-improvement algorithm with coefficients $\beta_1$, $\beta_2$, ..., $\beta_n$, the coefficients $\beta_1$, $\beta_2$, ..., $\beta_n$ are represented by said genes.

22. A method according to claim 18, wherein in said step (d), assuming that said third objective function generated in said step (b) is expressed as (Cost$_x$+$\alpha_x$U$_x$)+(Cost$_y$+$\alpha_y$U$_y$) where Cost$_x$ is an x-coordinate component of said first objective function, Cost$_y$ is a y-coordinate component of said first objective function, U$_x$ is an x-coordinate component of said second objective function, U$_y$ is a y-coordinate component of said second objective function, $\alpha_x$ is a function of a current iteration count of said iterative-improvement algorithm with coefficients $\beta_{x1}$, $\beta_{x2}$, ..., $\beta_{xn}$ and $\alpha_y$ is a function of a current iteration count of said iterative-improvement algorithm with coefficients $\beta_{y1}$, $\beta_{y2}$, ..., $\beta_{yn}$, the coefficients $\beta_{x1}$, $\beta_{x2}$, ..., $\beta_{xn}$ and the coefficients $\beta_{y1}$, $\beta_{y2}$, ..., $\beta_{yn}$ are represented by said genes.

23. A method according to claim 7, wherein said step (d) includes performing an exchanging crossover as a genetic operation on at least one pair of individuals in the population.

24. A method according to claim 7, wherein said step (d) includes performing a weighting crossover as a genetic operation on at least one pair of individuals in the population based on a weighted average of gene values of the two individuals of said pair.

25. A method according to claim 7, wherein said step (d) includes performing a mutation as a genetic operation on at least one individual in the population by varying a gene value of the one individual at random within a predetermined range.

26. A method according to claim 6, wherein said generating of said third objective function in said step (b) and said executing of said iterative-improvement algorithm in said step (c) are repeatedly carried out according to a predetermined schedule.

27. A method according to claim 26, wherein said step (b) includes:
   making a virtual layout of the multiple elements in the predetermined region, based on a current actual layout of the multiple elements in the predetermined region, in such a manner that the multiple elements are distributed in substantially uniform density throughout the predetermined region; and
   generating a function which represents a relationship between said virtual layout of the multiple elements and said current actual layout of the multiple elements as said second objective function.

28. A method according to claim 27, wherein in said step (b), the multiple elements are virtually disposed next to one another with respect to a vertex of the predetermined region so as to arrange the multiple elements in said virtual layout.

29. A method according to claim 27, wherein in said step (b), the multiple elements are virtually disposed next to one another with respect to a side of the predetermined region so as to arrange the multiple elements in said virtual layout.

30. A method according to claim 27, wherein in said step (b), the multiple elements are virtually disposed next to one another with respect to a center of the predetermined region so as to arrange the multiple elements in said virtual layout.

31. A method according to claim 27, wherein in said step (b), the multiple elements are virtually disposed next to one another with respect to an alternately selected one of vertices of the predetermined region so as to arrange the multiple elements in said virtual layout.

32. A method according to claim 27, wherein in said step (b), if the predetermined region has any local subregion in which an actual layout of the multiple elements is to be prohibited, the multiple elements are skipped over said local subregion while the multiple elements are arranged in the predetermined region in said virtual layout.

33. A method according to claim 27, wherein in said step (b), if the predetermined region has any local subregion in which an actual layout of the multiple elements is to be prohibited and if any one of the multiple elements is placed in a virtual position to overlap said local subregion while the multiple elements are arranged in said virtual layout, said virtual position of said one element is shifted outwardly off said local subregion in such a direction that a distance between a current actual position of said one element and the shifted virtual position of said one element is minimal.

34. A method according to claim 27, wherein in said step (b), if the predetermined region has any local subregion in which an actual layout of the multiple elements is to be prohibited and if any one of the multiple elements is placed in a virtual position to overlap said local subregion while the multiple elements are arranged in said virtual layout, said virtual position of said one element is shifted outwardly off said local subregion in such a direction that a distance between an outline of the local subregion and an outline of the predetermined region is maximal.

35. A method according to claim 27, wherein in said step (b), if the predetermined region has any local subregion in which an actual layout of the multiple elements is to be prohibited and if any one of the multiple elements is placed in a virtual position to overlap said local subregion while the multiple elements are arranged in said virtual layout, said virtual position of said one element is shifted outwardly off said local subregion in such a direction that a distance of shifting of said virtual position of said one element is minimal.

36. A method according to claim 27, wherein in said step (b), the multiple elements are arranged in said virtual layout based on said initial layout of the multiple elements obtained in said step (a).

37. A method according to claim 27, wherein in said step (b), the multiple elements are arranged in said virtual layout at each of one or more scheduled occasions in accordance with said predetermined schedule, based on said current actual layout of the multiple elements in said step (c) for each of the occasions.

38. A method according to claim 27, wherein in said step (b), the multiple elements are arranged in said virtual layout at each of one or more random occasions, based on said current actual layout of the multiple elements in said step (c) for each of the occasions.

39. A method according to claim 26, wherein in said step (b), said generating of a new third objective function is carried out at each of a plurality of scheduled occasions in accordance with said predetermined schedule, while at least one of 1) a coefficient of said linear combination of said first and second objective functions and 2) a definition of said second objective function varies for each of the occasions.

40. A method according to claim 6, wherein in said step (a), said second optimal solution to said second objective function is determined and obtained as said initial layout.

41. A method according to claim 6, wherein in said step (b), a function relating to density of the multiple elements is generated as said second objective function.

42. A method according to claim 6, wherein in said step (b), a function relating to area density of the multiple elements is generated as said second objective function.

43. A method according to claim 6, wherein in said step (b), a function relating to the number of overlaps between any two or more of the multiple elements is generated as said second objective function.

44. A method according to claim 6, wherein in said step (b), a function relating to the total area of overlaps between any two or more of the multiple elements is generated as said second objective function.

45. An apparatus for determining a first optimal solution to a first layout problem requiring an optimal layout of a multiplicity of elements in a predetermined region under a first set of conditions, which includes a uniformalization condition such that the multiple elements are distributed in substantially uniform density throughout the predetermined region, as the first optimal solution, comprising:

an objective-function generating section analyzing said first layout problem into the uniformalization condition and a second layout problem requiring an optimal layout of the multiple elements in the same predetermined region under a second set of conditions, which comprises the remaining conditions of the first set of conditions other than the uniformalization condition, as a second optimal solution and generating a linear combination of a first objective function, which represents the second set of conditions of the formulated second layout problem, and a second objective function, which represents the uniformalization condition of the first layout problem, as a third objective function, which is assumed to represent the first set of conditions of the first layout problem; and an objective-function optimizing section optimizing the third objective function generated by said objective-function generating section, thereby determining the first optimal solution to the first layout problem.

46. An apparatus for determining a first optimal solution to a first layout problem requiring an optimal layout of a multiplicity of elements in a predetermined region under a first set of conditions, which includes a uniformalization condition such that the multiple elements are distributed in substantially uniform density throughout the predetermined region, as the first optimal solution, comprising:

an initial-layout obtaining section obtaining an initial layout of the multiple elements in the predetermined region;

an objective-function generating section analyzing said first layout problem into the uniformalization condition and a second layout problem requiring an optimal layout of the multiple elements in the same predetermined region under a second set of conditions, which comprises the remaining conditions of the first set of conditions other than the uniformalization condition, as a second optimal solution and generating a linear combination of a first objective function, which represents the second set of conditions of the formulated second layout problem, and a second objective function, which represents the uniformalization condition of the first layout problem, as a third objective function, which is assumed to represent the first set of conditions of the first layout problem; and an iterative-improvement-algorithm executing section optimizing the third objective function generated in said objective-function generating section by executing an iterative-improvement algorithm on the third objective function using the initial layout obtained in said initial-layout obtaining section as an initial solution, thereby determining the first optimal solution to the first layout problem.

47. An apparatus according to claim 46, further comprising a genetic-algorithm executing section for representing at least one of a group of one or more first parameters, which relate to the generating of the third objective function in said objective-function generating section, and a group of one or more second parameters, which relate to the executing of the iterative-improvement algorithm in said iterative-improvement-algorithm executing section, as genes and for executing a genetic algorithm on an initial population of individuals each of which has at least one chromosome being a string of the genes;

wherein at least one of the generating of the third objective function in said objective-function generating section and the executing of the iterative-improvement algorithm in said iterative-improvement-algorithm executing section is carried out based on parameters represented by genes included in chromosomes of the individuals in the resultant population from the executing of the genetic algorithm in said genetic-algorithm executing section.

48. An apparatus according to claim 47, further comprising a schedule management section for preparing a schedule relating to the generation of the third objective function by said objective-function generating section, the execution of the iterative-improvement algorithm by said iterative-improvement-algorithm executing section and the execution of the genetic algorithm by said genetic-algorithm executing section, and for controlling said objective-function generating section, said iterative-improvement-algorithm executing section and said genetic-algorithm executing section to iteratively carry out the generation of the third objective function, the execution of the iterative-improvement algorithm and the execution of the genetic algorithm according to the prepared schedule.

49. An apparatus according to claim 46, further comprising a schedule management section for preparing a schedule relating to the generation of the third objective function by said objective-function generating section and the execution of the iterative-improvement algorithm by said iterative-improvement-algorithm executing section, and for controlling said objective-function generating section and said iterative-improvement-algorithm executing section to iteratively carry out the generation of the third objective function and the execution of the iterative-improvement algorithm according to the prepared schedule.

50. A computer-readable storage medium storing a computer program for determining a first optimal solution to a first layout problem requiring an optimal layout of a multiplicity of elements in a predetermined region under a first set of conditions, which includes a uniformalization condition such that the multiple elements are distributed in substantially uniform density throughout the predetermined region, as the first optimal solution, and said program instructs a computer to carry out the following procedures of:

(A) analyzing said first layout problem into the uniformalization condition and a second layout problem requiring an optimal layout of the multiple elements in the same predetermined region under a second set of conditions, which comprises the remaining conditions of the first set of conditions other than the uniformalization condition, as a second optimal solution and generating a linear combination of a first objective function, which represents the second set of conditions of said second layout problem, and a second objective function, which represents the uniformalization condition of said first layout problem, as a third objective function, which is assumed to represent the first set of conditions of said first layout problem; and (B) optimizing said third objective function generated in said procedure (A), whereby the first optimal solution to the first layout problem is determined.

51. A computer-readable storage medium storing a computer program for determining a first optimal solution to a first layout problem requiring an optimal layout of a multiplicity of elements in a predetermined region under a first set of conditions, which includes a uniformalization condition such that the multiple elements are distributed in substantially uniform density throughout the predetermined region, as the first optimal solution, and said program instructs a computer to carry out the following procedures of:

(a) obtaining an initial layout of the multiple elements in the predetermined region;

(b) analyzing said first layout problem into the uniformalization condition and a second layout problem requiring an optimal layout of the multiple elements in the same predetermined region under a second set of conditions, which comprises the remaining conditions of the first set of conditions other than the uniformalization condition, as a second optimal solution and generating a linear combination of a first objective function, which represents the second set of conditions of said second layout problem, and a second objective function, which represents the uniformalization condition of said first layout problem, as a third objective function, which is assumed to represent the first set of conditions of said first layout problem; and (c) optimizing the third objective function generated in said procedure (b) by executing an iterative-improvement algorithm on said third objective function using said initial layout obtained in said procedure (a) as an initial solution, whereby the first optimal solution to the first layout problem is determined.

52. A computer-readable storage medium according to claim 51, wherein:

said program further instructs the computer to carry out the procedure of (d) representing at least one of a group of one or more first parameters, which relate to said generating of said third objective function in said procedure (b), and a group of one or more second parameters, which relate to said executing of said iterative-improvement algorithm in said procedure (c), as genes and executing a genetic algorithm on an initial population of individuals each of which has at least one chromosome being a string of the genes; and at least one of said generating of said third objective function in said procedure (b) and said executing of said iterative-improvement algorithm in said procedure (c) is carried out based on parameters represented by genes included in chromosomes of the individuals in the resultant population from said executing of said genetic algorithm in said procedure (d).

53. A computer-readable storage medium according to claim 52, wherein said program further instructs the computer so that said generating of said third objective function in said procedure (b), said executing of said iterative-improvement algorithm in said procedure (c) and said executing of said genetic algorithm in said procedure (d) are repeatedly carried out according to a predetermined schedule.

54. A computer-readable storage medium according to claim 51, wherein said program further instructs the computer so that said generating of said third objective function in said procedure (b) and said executing of said iterative-improvement algorithm in said procedure (c) are repeatedly carried out according to a predetermined schedule.

55. A computer-implemented method comprising:

analyzing a first layout problem requiring an optimal layout of a plurality of elements in a predetermined region under a first set of conditions that includes a uniformalization condition, into a first objective function defined by the uniformalization condition, and a second objective function defined by a second set of conditions, which comprises the remaining conditions of the first set of conditions other than the uniformalization condition;

generating a linear combination of the first objective function and the second objective function, as a third objective function; and optimizing the third objective function, wherein the uniformalization condition requires that the plurality of elements are distributed in substantially uniform density throughout the predetermined region.

56. A computer-implemented method comprising:

analyzing a first problem to layout a plurality of elements under a first set of conditions that includes a uniformalization condition, into a first objective function defined by the uniformalization condition, and a second objective function defined by a second set of conditions, which comprises the remaining conditions of the first set of conditions other than the uniformalization condition;

generating a linear combination of the first objective function and the second objective function, as a third objective function; and optimizing the third objective function.

57. An apparatus comprising:

a means for analyzing a first problem to layout a plurality of elements under a first set of conditions that includes a uniformalization condition, into a first objective function defined by the uniformalization condition, and a second objective function defined by a second set of conditions, which comprises the remaining conditions of the first set of conditions other than the uniformalization condition;

a means for generating a linear combination of the first objective function and the second objective function, as a third objective function; and a means for optimizing the third objective function.

* * * * *